United States Patent
Mokhlesi

(10) Patent No.: US 8,045,391 B2
(45) Date of Patent: *Oct. 25, 2011

(54) NON-VOLATILE MEMORY AND METHOD WITH IMPROVED SENSING HAVING BIT-LINE LOCKOUT CONTROL

(75) Inventor: Nima Mokhlesi, Los Gatos, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/897,089

(22) Filed: Oct. 4, 2010

(65) Prior Publication Data

US 2011/0019484 A1    Jan. 27, 2011

Related U.S. Application Data

(63) Continuation of application No. 12/371,479, filed on Feb. 13, 2009, now Pat. No. 7,808,832, which is a continuation of application No. 11/759,898, filed on Jun. 7, 2007, now Pat. No. 7,492,640.

(51) Int. Cl.
*G11C 16/06* (2006.01)

(52) U.S. Cl. ......... 365/185.21; 365/185.22; 365/185.03; 365/185.18; 365/185.25

(58) Field of Classification Search ............. 365/185.21, 365/185.22, 185.03, 185.18, 185.25
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari et al. |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |

(Continued)

FOREIGN PATENT DOCUMENTS

JP   2006-508483 A   3/2006

(Continued)

OTHER PUBLICATIONS

Eitan et al., "NROM: A Novel Localized Trapping 2-Bit Nonvolatile Memory Cell," IEEE Electron Device Letters, vol. 21, No. 11, Nov. 2000, pp. 543-545.

(Continued)

*Primary Examiner* — Huan Hoang
(74) *Attorney, Agent, or Firm* — Davis Wright Tremaine LLP

(57) ABSTRACT

In sensing a group of cells in a multi-state nonvolatile memory, multiple sensing cycles relative to different demarcation threshold levels are needed to resolve all possible multiple memory states. Each sensing cycle has a sensing pass. It may also include a pre-sensing pass or sub-cycle to identify the cells whose threshold voltages are below the demarcation threshold level currently being sensed relative to. These are higher current cells which can be turned off to achieve power-saving and reduced source bias errors. The cells are turned off by having their associated bit lines locked out to ground. A repeat sensing pass will then produced more accurate results. Circuitry and methods are provided to selectively enable or disable bit-line lockouts and pre-sensing in order to improving performance while ensuring the sensing operation does not consume more than a maximum current level.

28 Claims, 25 Drawing Sheets

U.S. PATENT DOCUMENTS

| | | | |
|---|---|---|---|
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 6,657,891 B1 | 12/2003 | Shibata et al. | |
| 7,170,784 B2 | 1/2007 | Cernea et al. | |
| 7,173,854 B2 | 2/2007 | Cernea et al. | |
| 7,196,931 B2 | 3/2007 | Cernea et al. | |
| 7,251,160 B2 | 7/2007 | Li et al. | |
| 7,489,553 B2 | 2/2009 | Mokhlesi | |
| 7,492,640 B2 | 2/2009 | Mokhlesi | |
| 7,808,832 B2 * | 10/2010 | Mokhlesi | 365/185.21 |
| 2004/0057287 A1 | 3/2004 | Cernea et al. | |
| 2005/0057967 A1 | 3/2005 | Khalid et al. | |
| 2005/0078524 A1 | 4/2005 | Hosono | |
| 2005/0169082 A1 | 8/2005 | Cernea | |
| 2006/0209592 A1 | 9/2006 | Li et al. | |
| 2006/0221693 A1 | 10/2006 | Cernea et al. | |
| 2007/0171746 A1 | 7/2007 | Tsao et al. | |
| 2008/0304316 A1 | 12/2008 | Mokhlesi | |
| 2009/0147586 A1 | 6/2009 | Mokhlesi | |

FOREIGN PATENT DOCUMENTS

| | | |
|---|---|---|
| JP | 2007-506222 A | 3/2007 |
| WO | WO 2004/029984 A2 | 4/2004 |
| WO | WO 2005/029503 A1 | 3/2005 |

OTHER PUBLICATIONS

EPO/ISA, "Notification of Transmittal of the International Search Report and the Written Opinion of the International Searching Authority, or the Declaration," corresponding International Patent Application No. PCT/US2008/065681, mailed on Oct. 2, 2008, 15 pages.

USPTO, "Notice of Allowance and Fee(s) Due," mailed in related U.S. Appl. No. 11/759,909 on Oct. 8, 2008, 17 pages.

USPTO, "Notice of Allowance and Fee(s) Due," mailed in related U.S. Appl. No. 11/759,898 on Oct. 7, 2008, 15 pages.

EPO, "Examiner's Report," corresponding European Patent Application No. 08 756 667.5, mailed on Sep. 17, 2010, 1 page.

JPO, "Notification of Reasons for Refusal," corresponding Japanese Patent Application No. 2010-511286, mailed on Jun. 28, 2011, 6 pages (including translation.).

* cited by examiner

Convention Programming with alternate Progam/Verify sequence

| Sensing relative to a given memory state | Seleted WL Voltage | Sensing | | | |
|---|---|---|---|---|---|
| | | 1st pass | | 2nd pass | |
| "A" | $D_A$ | Pre-sensing | Lockout High $i$ BLs | Sensing | Lockout High $i$ BLs |
| "B" | $D_B$ | Pre-sensing | Lockout High $i$ BLs | Sensing | Lockout High $i$ BLs |
| "C" | $D_C$ | Pre-sensing | Lockout High $i$ BLs | Sensing | Lockout High $i$ BLs |
| "D" | $D_D$ | Pre-sensing | Lockout High $i$ BLs | Sensing | Lockout High $i$ BLs |
| "E" | $D_E$ | Pre-sensing | Lockout High $i$ BLs | Sensing | Lockout High $i$ BLs |
| "F" | $D_F$ | Pre-sensing | Lockout High $i$ BLs | Sensing | Lockout High $i$ BLs |
| "G" | $D_G$ | Pre-sensing | Lockout High $i$ BLs | Sensing | Lockout High $i$ BLs |

FIG. 14    PRIOR ART

| Sensing relative To a given memory state | Seleted WL Voltage | Sensing | | |
|---|---|---|---|---|
| | | 1st pass | | 2nd pass |
| "A" | $D_A$ | Pre-sensing | Lockout High $i$ BLs | Sensing |
| "B" | $D_B$ | Pre-sensing | Lockout High $i$ BLs | Sensing |
| "C" | $D_C$ | Pre-sensing | Lockout High $i$ BLs | Sensing |
| "D" | $D_D$ | Pre-sensing | Lockout High $i$ BLs | Sensing |
| "E" | $D_E$ | Pre-sensing | Lockout High $i$ BLs | Sensing |
| "F" | $D_F$ | Pre-sensing | Lockout High $i$ BLs | Sensing |
| "G" | $D_G$ | Pre-sensing | Lockout High $i$ BLs | Sensing |

*FIG. 17A*

| Page of pseudo-randomized data |
|---|

Sensing with Bit-line Lockout Control

| Sensing relative To a given memory state | Seleted WL Voltage | Sensing 1st pass |
|---|---|---|
| "A" | $D_A$ | Sensing pass |
| "B" | $D_B$ | Sensing pass |
| "C" | $D_C$ | Sensing pass |
| "D" | $D_D$ | Sensing pass |
| "E" | $D_E$ | Sensing pass |
| "F" | $D_F$ | Sensing pass |
| "G" | $D_G$ | Sensing pass |

*FIG. 24*

NON-VOLATILE MEMORY AND METHOD WITH IMPROVED SENSING HAVING BIT-LINE LOCKOUT CONTROL

CROSS REFERENCE TO RELATED APPLICATION

This application is a continuation of U.S. patent application Ser. No. 12/371,479, filed on Feb. 13, 2009, now U.S. Pat. No. 7,808,832, which is a continuation of U.S. patent application Ser. No. 11/759,898, filed on Jun. 7, 2007, by Nima Mokhlesi, entitled "Improved Sensing with Bit-line Lockout Control in Non-Volatile Memory," now U.S. Pat. No. 7,492,640. This application also related to U.S. application Ser. No. 11/759,909, filed on Jun. 7, 2007, by Nima Mokhlesi, entitled "Non-Volatile Memory with Improved Sensing with Bit-line Lockout Control," now U.S. Pat. No. 7,489,553.

FIELD OF THE INVENTION

This invention relates generally to non-volatile semiconductor memory such as electrically erasable programmable read-only memory (EEPROM) and flash EEPROM, and specifically to memory and sensing operations in which control is exerted on the locking out of the bit lines associated with relatively high conduction current memory cells.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window (also referred to as a "conduction window".) The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Programming a page of memory cells typically involves a series of alternating program/verify cycles. Each program cycle has the page of memory cells subject to one or more programming voltage pulses. The program cycle is followed by a verify cycle in which each cell is read back to determine if it has been programmed correctly. Those cells that have been verified will be program-inhibited from subsequent programming pulses. The program/verify cycles continue with increasing programming voltage level until all cells in the page have been program-verified.

Both reading and verifying operations are performed by executing one or more sensing cycle in which the conduction current or threshold voltage of each memory cell of the page is determined relative to a demarcation value. In general, if the memory is partitioned into n states, there will be at least n−1 sensing cycles to resolve all possible memory states. In many implementations each sensing cycle may also involve two or more passes. For example, when the memory cells are closely packed, interactions between neighboring charge storage elements become significant and some sensing techniques involves sensing memory cells on neighboring word lines in order to compensate for errors caused by these interactions. Thus, as more memory cells are being highly integrated into a chip and more and more states are being packed into each memory cell to increase capacity, the reading and verifying performance are greatly impacted due to the number of iterations needed.

Therefore there is a general need for high capacity and high performance non-volatile memory. In particular, there is a need to have a high capacity nonvolatile memory with improved sensing performance where the aforementioned disadvantage is minimized.

SUMMARY OF INVENTION

According to a general aspect of the invention, when a page of memory cells is being sensed in parallel, the instance of a bit-line lockout, which is the grounding of a bit-line to shut down a memory cell exceeding a predetermined current level, is reduced to a minimum. In this way, additional sensing sub-cycles to identify and shut down the high-current cells are skipped as much as a given budget for current consumption would allow, and sensing at a selective number of sensing control gate voltages will result in bit lines that are detected to correspond to ON cells to shut down, while sensing at other control gate voltages will not result in any such bit line shut down operation. Through the application of this technique the performance of the sensing operation is improved by reducing the number of sensing sub-cycles as well as reducing the noise generated due to bit-line-to-bit-line coupling when shutting down the bit lines. In this context, bit-line-to-bit-line coupling refers to the capacitive couplings that exist between neighbor global bit lines.

In a preferred embodiment, the bit-line lockout is implemented by a pull-down circuit which is capable of pulling the bit line to ground. The pull-down circuit comprises two pass gates in series between the bit-lines and the ground. The two pass gates form an AND gate with one pass gate controlled by a pull-down enabling or disabling control signal and the other pass gate controlled by whether the cell in question is sensed to have a current higher or lower than a reference current. When the pull-down circuit is disabled, the bit line will not be grounded irrespective of the sensed result. When the pull-down circuit is enabled, the bit line will be pulled to ground when the sensed result is from a high current memory cell.

In one implementation of sensing a multi-state memory involving multiple sensing passes for the page of memory cells relative to each of the multiple states, the step of locking out of the bit lines associated with memory cells identified with higher than the predetermined current level is only implemented at predetermined sensing passes. In this way, the benefit of bit-line lockouts to reduce the total current and source bias error is reaped while its negative effect of longer sensing time due to more sub-cycles and longer waiting time for the generated noise to subside is alleviated. To ensure uniform distribution of high current states among a page, the page is preferably coded so that data are stored with relatively even distributions among all possible memory states. In a preferred embodiment, the coded data appears as pseudo-random.

According to another aspect of the invention, the reduction of bit-line lockouts is commensurate with the total current flowing in the page of memory cells not exceeding a predetermined maximum current. In this way, bit-line lockouts is minimized but invoked when the total current, which is data dependent, is about to exceed a predetermined current level.

In one implementation of sensing a multi-state memory involving multiple sensing passes for the page of memory cells relative to each of the multiple states, the step of locking out of the bit lines associated with memory cells identified with higher than the predetermined current level is only implemented at a sensing pass when the total current flowing in the page of the memory cells is about to exceed the predetermined maximum current.

In one embodiment, a current monitor is provided to monitor the total current flowing in the page of memory cells.

In another embodiment, the number of bit lines that correspond to highly conducting cells is accumulated and this information is used to estimate the total current flowing in the page of memory cells.

Additional features and advantages of the present invention will be understood from the following description of its preferred embodiments, which description should be taken in conjunction with the accompanying drawings.

BRIEF DESCRIPTION OF THE DRAWINGS

FIG. 7(2) illustrates a preferred, 2-bit LM coding to represent the four possible memory states shown in FIG. 7(1).

FIG. 8(2) illustrates a preferred, 3-bit LM coding to represent the eight possible memory states shown in FIG. 8(1).

FIG. 14 illustrates schematically an example of applying the existing two-pass sensing scheme on the 8-state memory shown in FIG. 8.

FIG. 17A illustrates one exemplary schedule for selectively enabling bit-line lockout among the multiple passes of a multi-state sensing operation.

FIG. 24 illustrates yet another embodiment of a single-pass sensing where the actual sensing is executed without any lock out of high-current cells.

DETAILED DESCRIPTION OF THE PREFERRED EMBODIMENTS

Memory System

FIG. 1 to FIG. 9 illustrate example memory systems in which the various aspects of the present invention may be implemented.

FIG. 10 to FIG. 21 illustrate the various aspects and embodiments of the present invention.

Figure 1:
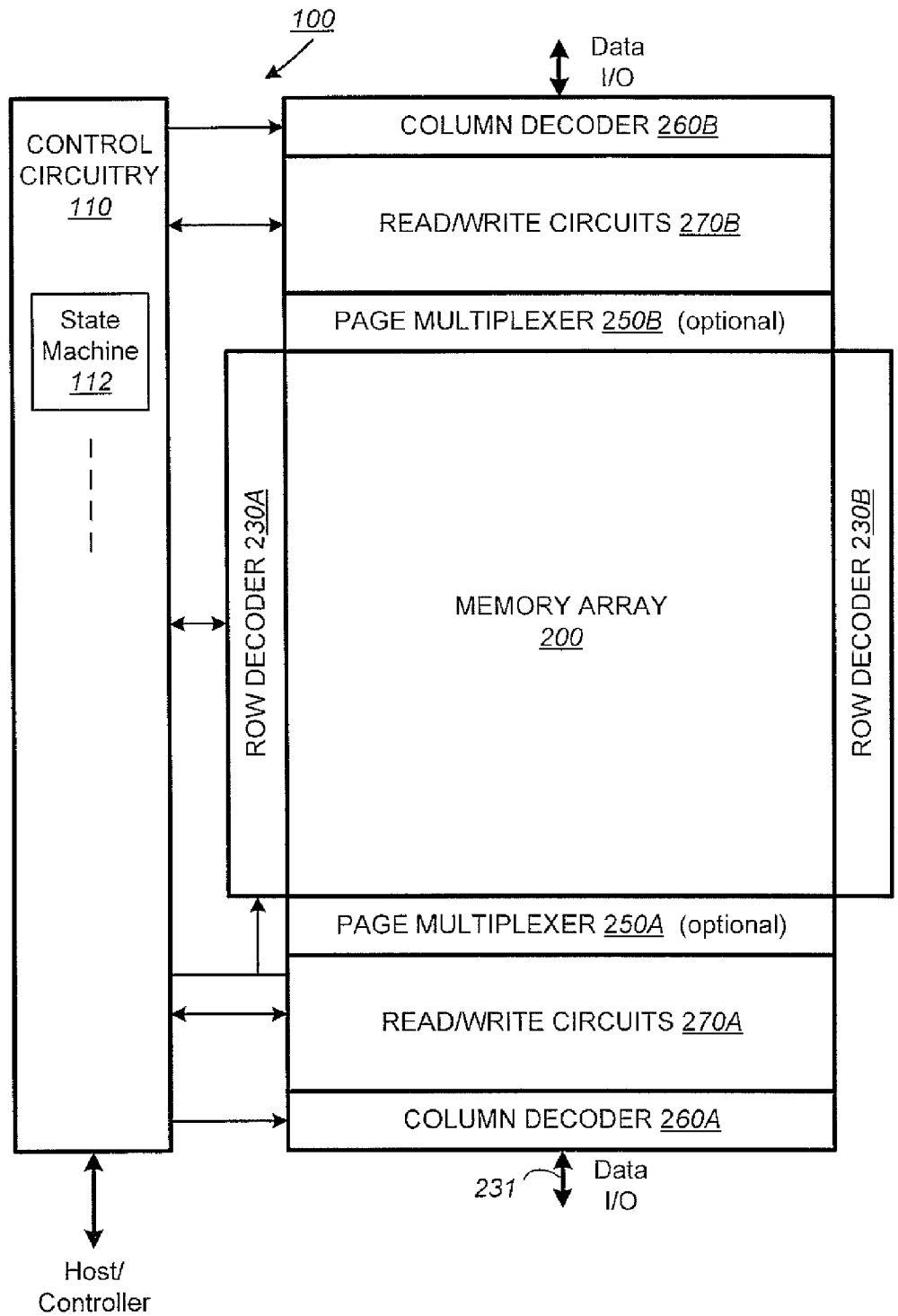
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
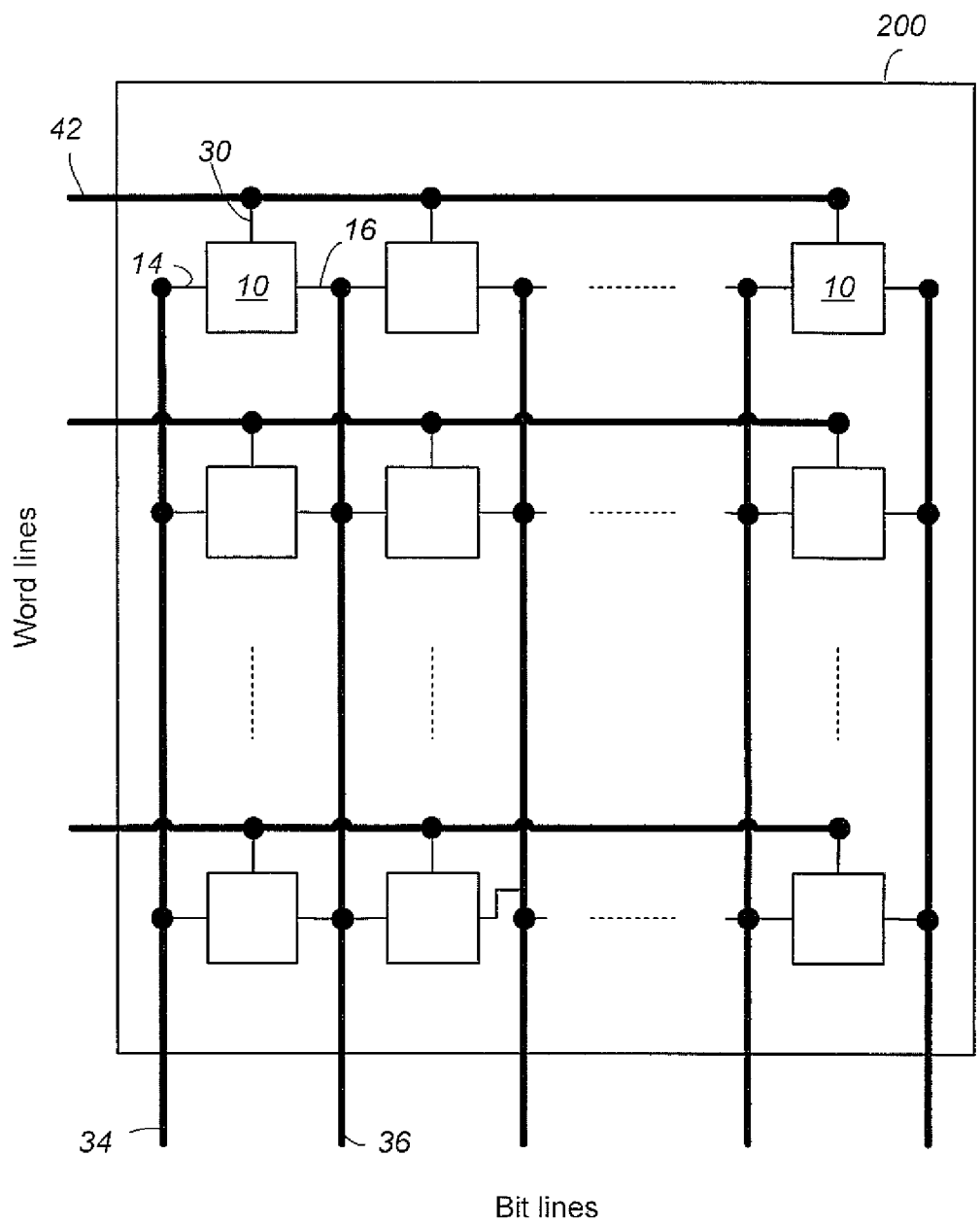
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
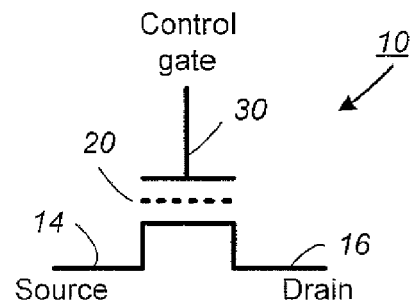
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
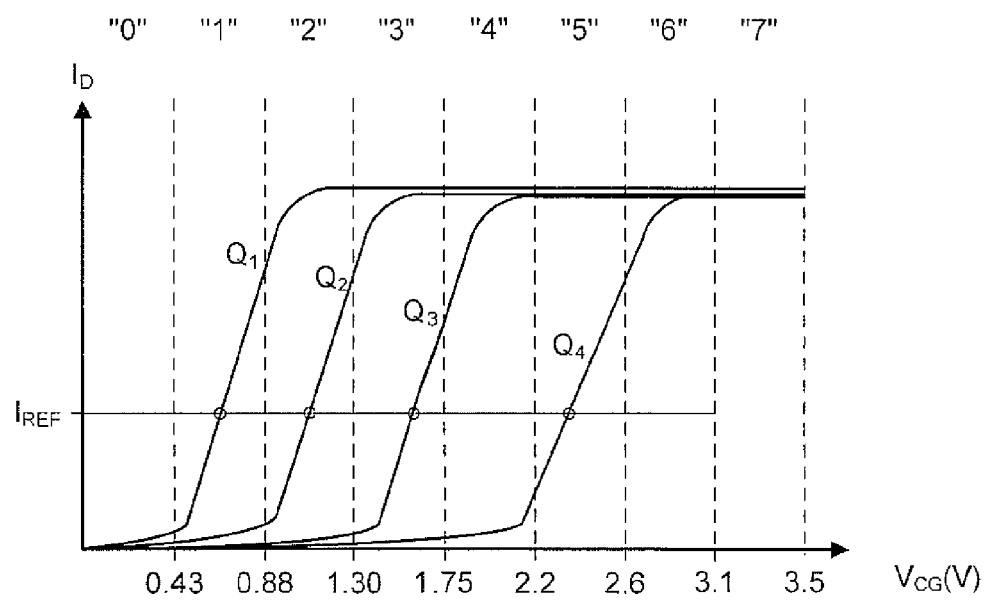
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6" and "7" respectively representing one erased and seven programmed states, may be demarcated by partitioning the threshold window into eight regions in interval of about 0.4V each. For example, if a reference current, IREF of 0.05 uA is used as shown, then the cell programmed with Q1 may be considered to be in a memory state "1" since its curve intersects with $I_{REF}$ in the region of the threshold window demarcated by VCG=0.43V and 0.88V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 350 mV to 450 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
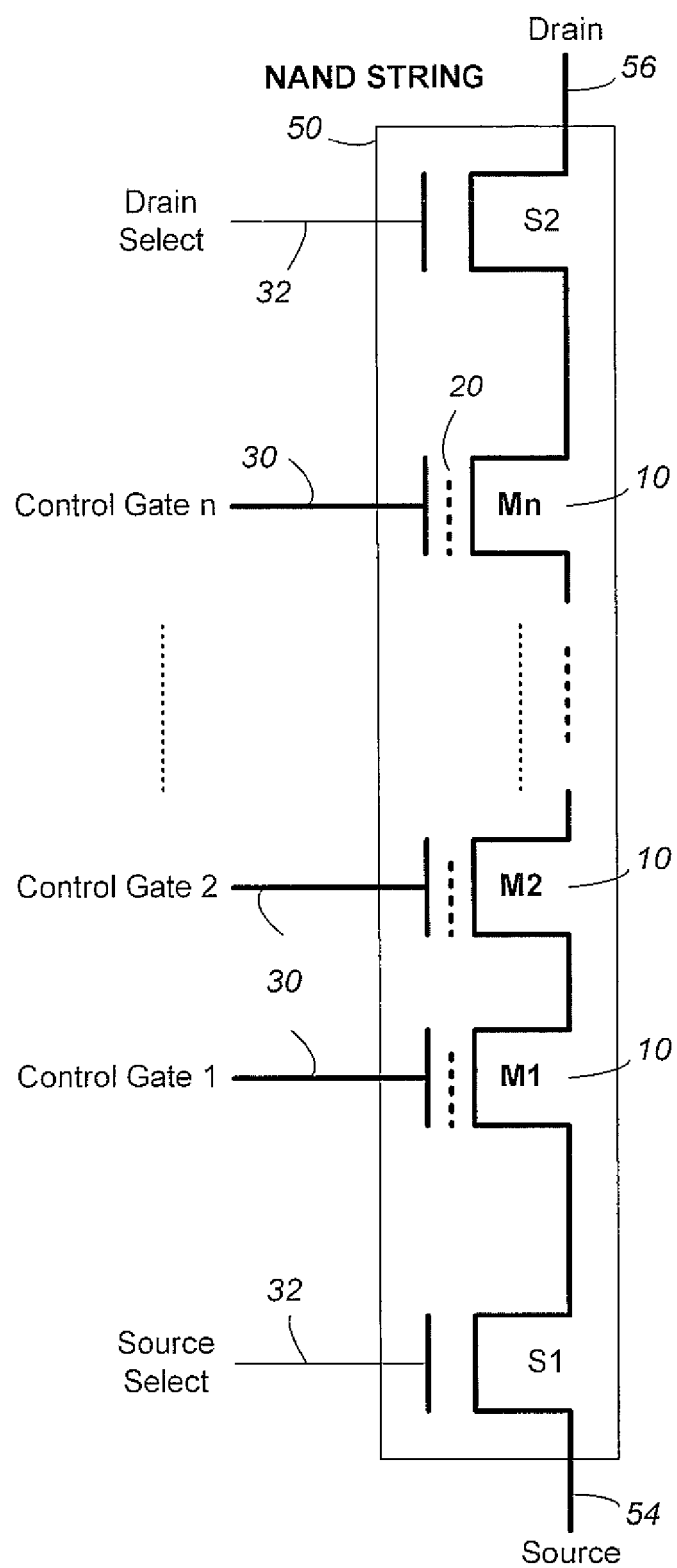
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor Si is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
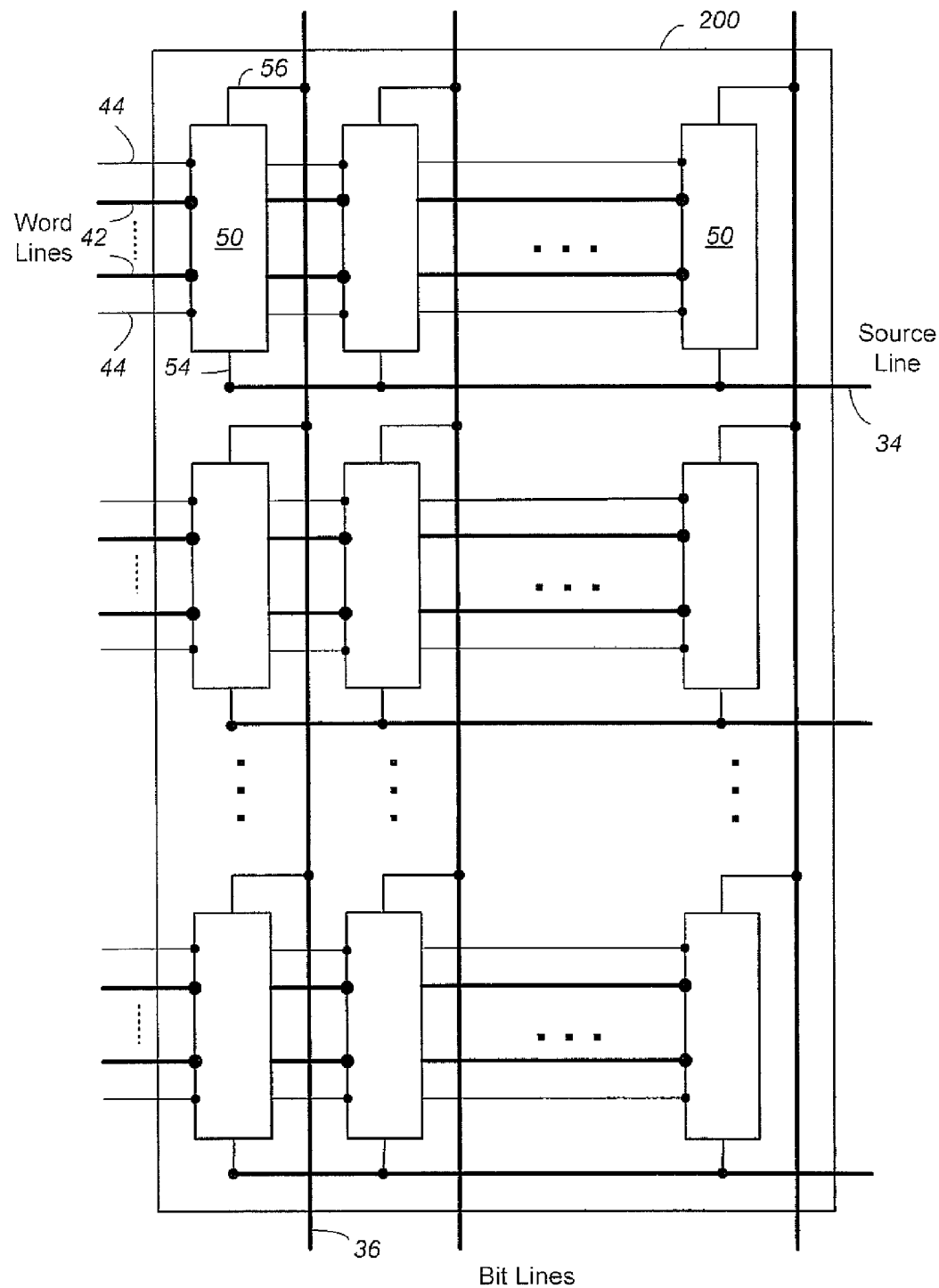
FIG. 5B illustrates an example of an NAND array of memory cells, constituted from NAND strings such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Program and Verify

Figure 6:
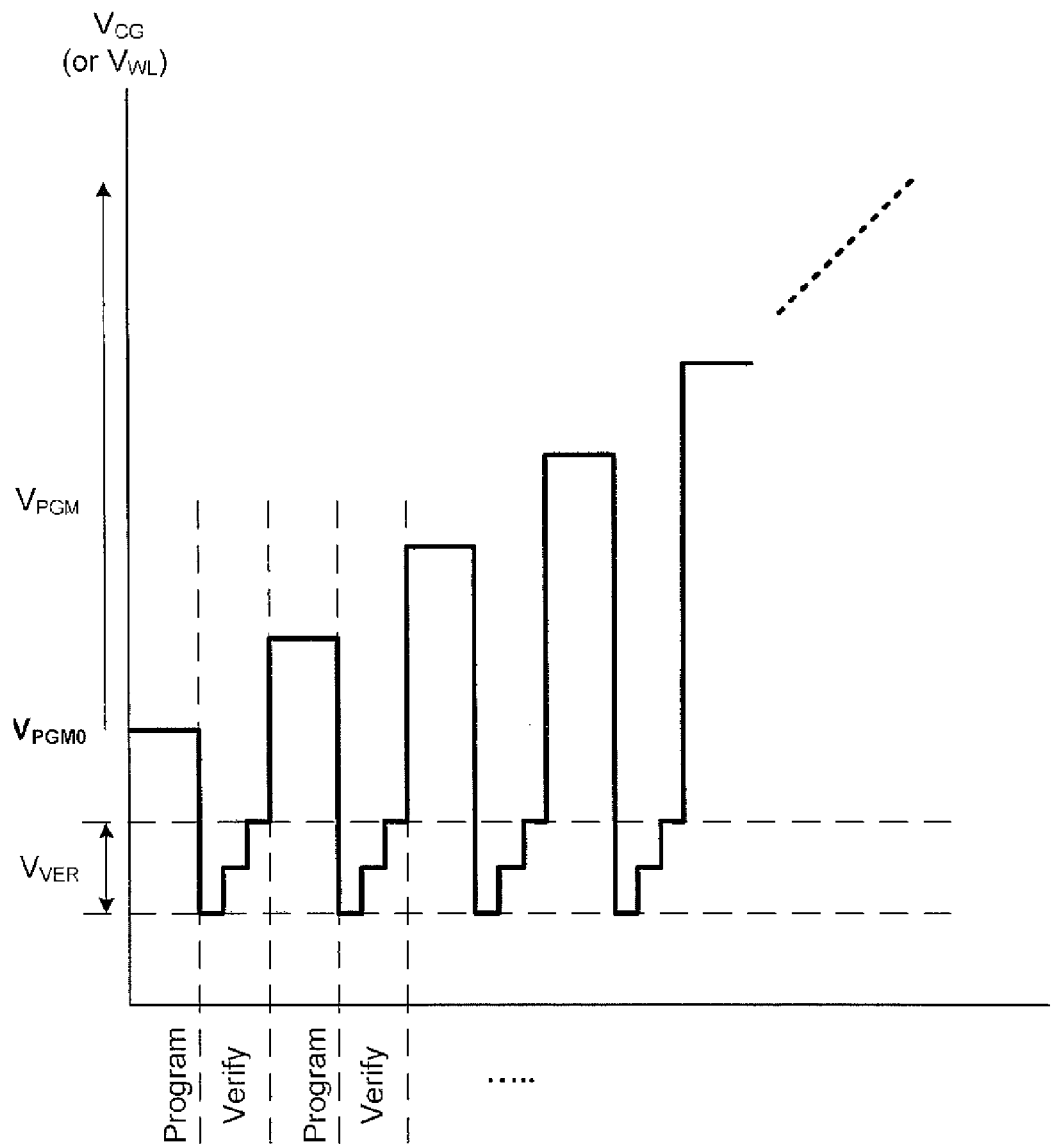
FIG. 6 illustrates a typical technique for programming a page of memory cells to a target memory state by a series of alternating program/verify cycles.

FIG. 6 illustrates a typical technique for programming a page of memory cells to a target memory state by a series of alternating program/verify cycles. A programming voltage $V_{PGM}$ is applied to the control gate of the memory cell via a coupled word line. The $V_{PGM}$ is a series of programming voltage pulses in the form of a staircase waveform starting from an initial voltage level, $V_{PGM0}$. The cell under programming is subject to this series of programming voltage pulses, with an attempt each time to add incremental charges to the floating gate. In between programming pulses, the cell is read back or verified to determine its source-drain current relative to a breakpoint level. The read back process may involve one or more sensing operation. Programming stops for the cell when it has been verified to reach the target state. The programming pulse train used may have increasing period or amplitude in order to counteract the accumulating electrons programmed into the charge storage unit of the memory cell. Programming circuits generally apply a series of programming pulses to a selected word line. In this way, a page of memory cells whose control gates are coupled to the word line can be programmed together. Whenever a memory cell of the page has been programmed to its target state, it is program-inhibited while the other cells continue to be subject to programming until all cells of the page have been program-verified.

Examples of Memory State Partitioning

Figure 7:
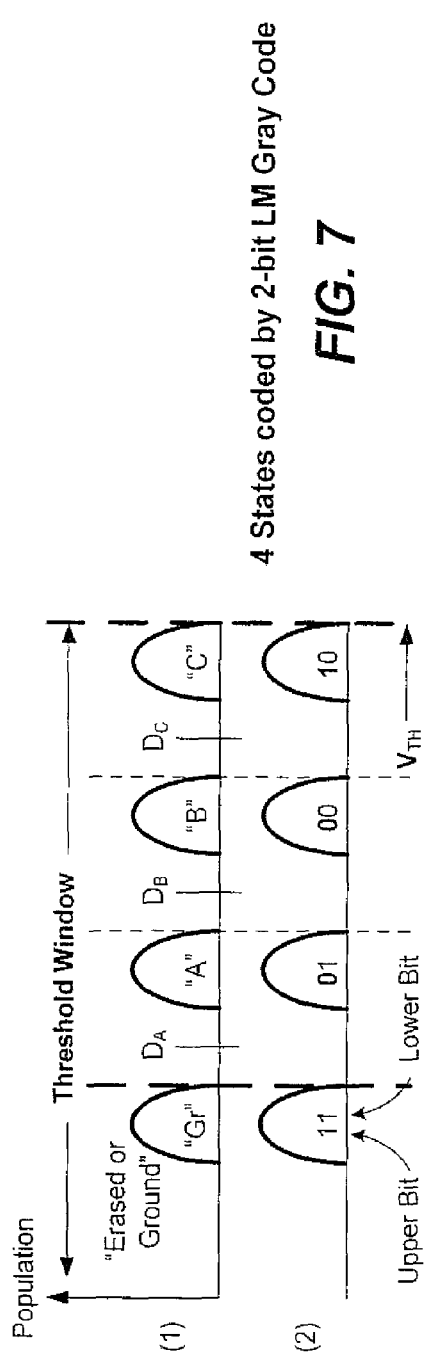
FIG. 7(1) illustrates the threshold voltage distributions of an example 4-state memory array with an erased state as a ground state "Gr" and progressively more programmed memory states "A", "B" and "C".

FIG. 7(1) illustrates the threshold voltage distributions of an example 4-state memory array with an erased state as a ground state "Gr" and progressively more programmed memory states "A", "B" and "C". During read, the four states are demarcated by three demarcation breakpoints, $D_A$-$D_C$.

FIG. 7(2) illustrates a preferred, 2-bit LM coding to represent the four possible memory states shown in FIG. 7(1). Each of the memory states (viz., "Gr", "A", "B" and "C") is represented by a pair of "upper, lower" code bits, namely "11", "01", "00" and "10" respectively. The "LM" code has been disclosed in U.S. Pat. No. 6,657,891 and is advantageous in reducing the field-effect coupling between adjacent floating gates by avoiding program operations that require a large change in charges. The coding is designed such that the 2 code bits, "lower" and "upper" bits, may be programmed and read separately. When programming the lower bit, the threshold level of the cell either remains in the "erased" region or is moved to a "lower middle" region of the threshold window. When programming the upper bit, the threshold level of a cell in either of these two regions is further advanced to a slightly higher level in a "lower intermediate" region of the threshold window.

Figure 8:
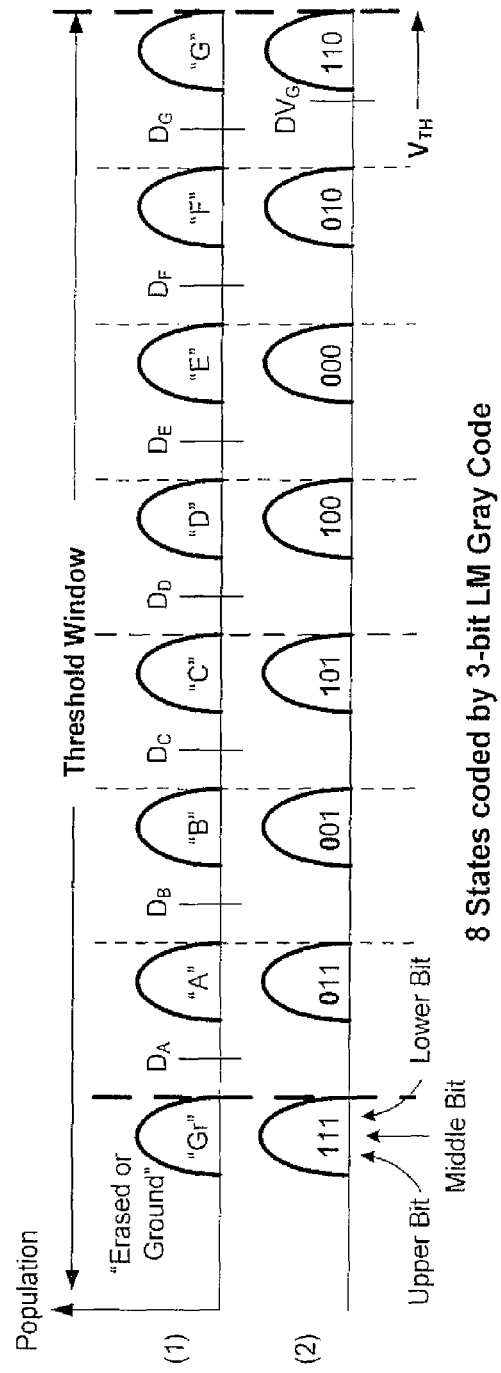
FIG. 8(1) illustrates the threshold voltage distributions of an example 8-state memory array.

FIG. 8(1) illustrates the threshold voltage distributions of an example 8-state memory array. The possible threshold voltages of each memory cell spans a threshold window which is partitioned into eight regions to demarcate eight possible memory states, "Gr", "A", "B", "C", "D", "E", "F" and "G". "Gr" is a ground state, which is an erased state within a tightened distribution and "A"-"G" are seven progressively programmed states. During read, the eight states are demarcated by seven demarcation breakpoints, $D_A$-$D_G$.

FIG. 8(2) illustrates a preferred, 3-bit LM coding to represent the eight possible memory states shown in FIG. 8(1). Each of the eight memory states is represented by a triplet of "upper, middle, lower" bits, namely "111", "011", "001", "101", "100", "000", "010" and "110" respectively. The coding is designed such that the 3 code bits, "lower", "middle" and "upper" bits, may be programmed and read separately. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a narrow range of threshold values. The "lower intermediate" states may have a broad distribution of threshold voltages that straddling between memory states "B" and "D". During programming, the "lower intermediate" state can be verified relative to a coarse breakpoint threshold level such as $D_B$. When programming the middle bit, the threshold level of a cell will start from one of the two regions resulted from the lower page programming and move to one of four possible regions. When programming the upper bit, the threshold level of a cell will start from one of the four possible regions resulted from the middle page programming and move to one of eight possible memory states.

Sensing Circuits and Techniques

Figure 9:
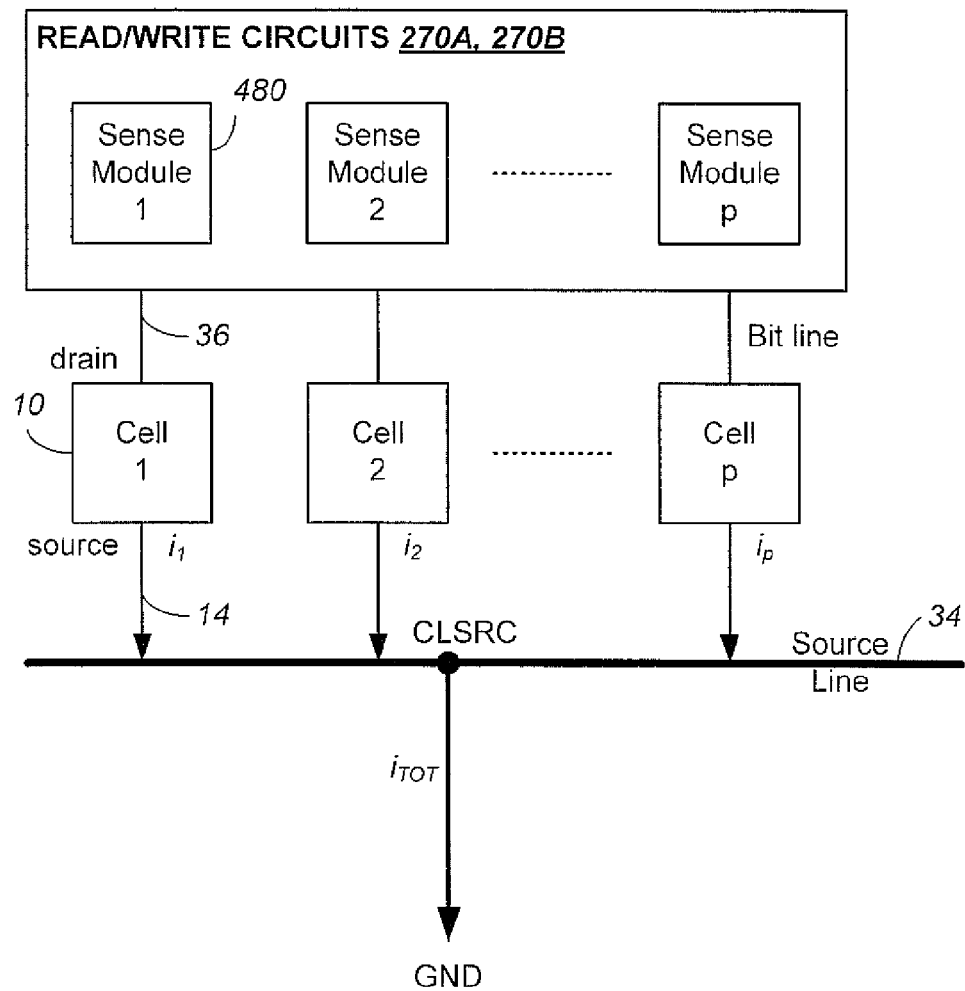
FIG. 9 illustrates the Read/Write Circuits, shown in FIG. 1, containing a bank of sense modules across an array of memory cells.

FIG. 9 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B. Preferred sense modules have been disclosed in US Patent Publication No. 2005-0169082-A1, dated Aug. 4, 2005 by Cernea et al., entitled "IMPROVED MEMORY SENSING CIRCUIT AND METHOD FOR LOW VOLTAGE OPERATION". The entire disclosure of US Patent Publication No. 2005-0169082-A1 is incorporated herein by reference.

Figure 10:
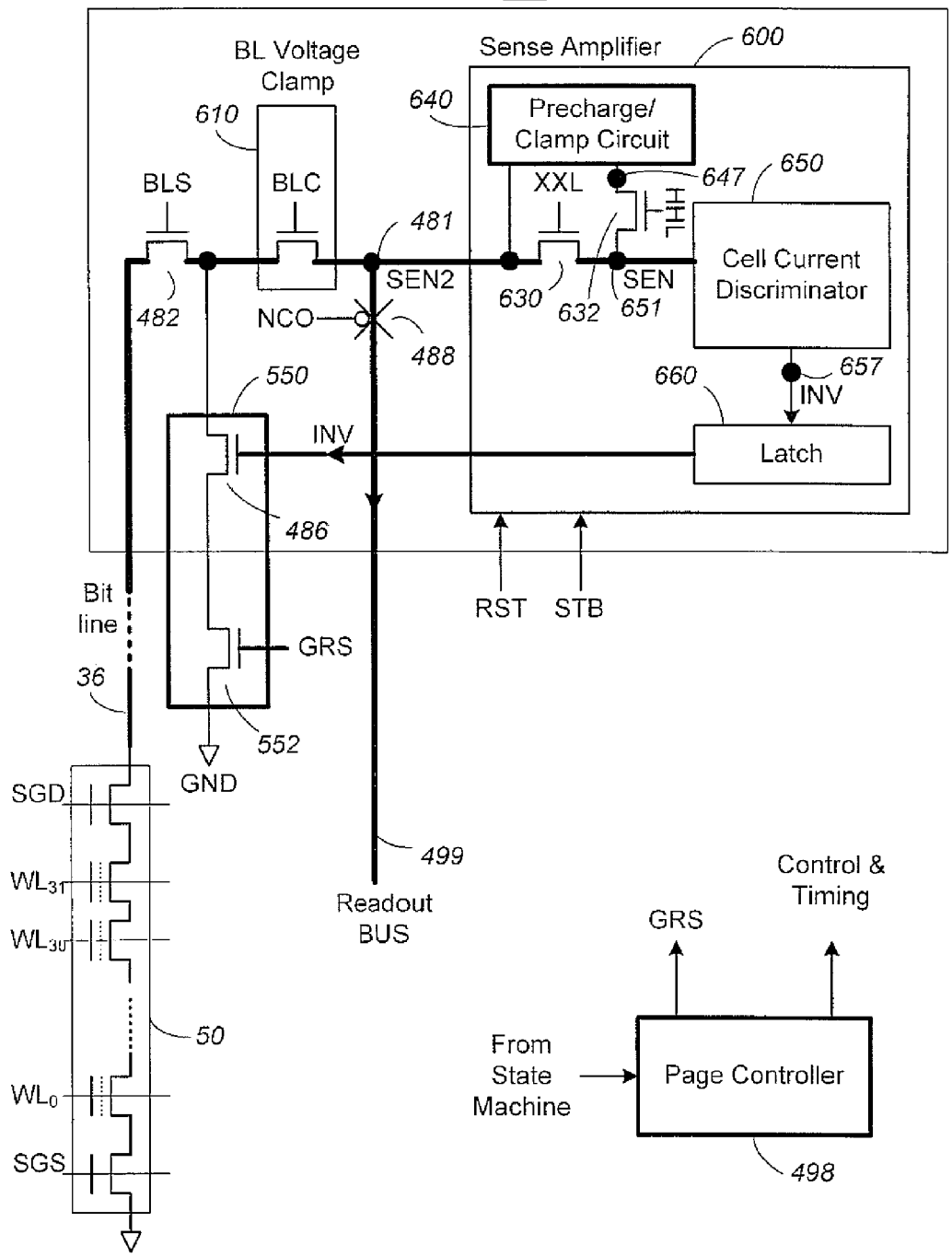
FIG. 10 illustrates schematically in more detail the sense module shown in FIG. 9 that is suitable for practicing the invention.

FIG. 10 illustrates schematically in more detail the sense module shown in FIG. 9 that is suitable for practicing the invention. The sense module 480 senses the conduction current of a memory cell in a NAND chain 50 via a coupled bit line 36. It has a sense node 481 that can be selectively coupled to a bit line, a sense amplifier 600 and a readout bus 499. Initially, an isolation transistor 482, when enabled by a signal BLS connects the bit line 36 to the sense node 481. The sense amplifier 600 senses the sense node 481. The sense amplifier includes a precharge/clamp circuit 640, a cell current discriminator 650 and a latch 660. The sense module 480 enables the conduction current of the selected memory cell in the NAND chain to be sensed.

In a preferred embodiment, a pull-down circuit 550 is provided for selectively pulling the bit line 36 to ground. The pull-down circuit 550 is activated when both the signal INV and another signal GRS are both HIGH. The signal GRS which is control from the state machine 110 (see FIG. 1) is supplied as part of the control and timing signals from the page controller 498. As will be described in more detail later, the signal GRS may be regarded as the control signal by the state machine to enable (GRS=HIGH) or disable (GRS=LOW) the pull-down circuit 550 in order to respectively enable or disable the locking out of high-current bitlines. When the sensing indicates a high-current state, INV will be HIGH and if the pull-down circuit is enabled, it will pull-down the bit line.

Prior to sensing, the voltages to the electrodes of the selected memory cell must be set via the appropriate word lines and bit line in one or more precharge operation. For example, as shown in FIG. 10, a page of memory cells along a word line WL1 intersecting the NAND chain 50 may be selected for sensing. The precharge operation starts with the unselected word lines WL0, WL2-WL31 being charged to a voltage Vread and the selected world line WL1 being charged to a predetermined threshold voltage $V_T(i)$ for a given memory state under consideration. Then the bit line precharge circuit 640 brings the bit line 36 to a predetermined drain voltage appropriate for sensing. This will induce a source-drain conduction current to flow in the selected memory cell in the NAND chain 50, which is detected from the channel of the NAND chain via a coupled bit line 36. The conduction current is a function of the charge programmed into the selected memory cell and the applied $V_T(i)$ when there exists a nominal voltage difference between the source and drain of the memory cell.

Figure 11A:
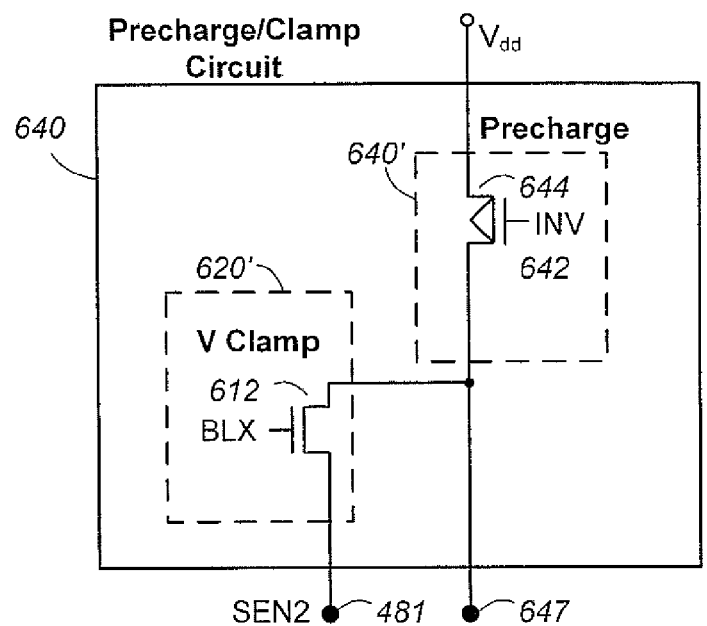
FIG. 11A illustrates in more detail the Precharge/Clamp circuit shown in FIG. 10.

FIG. 11A illustrates in more detail the Precharge/Clamp circuit shown in FIG. 10. The circuit has a voltage clamp 620' component and a precharge circuit 640' component. The voltage clamp 620' is implemented by a transistor 612 controlled by an analog signal BLX at its gate. BLX is such that it ensures sufficient voltage on the node SEN2 481 (see FIG. 10) so that the bit line voltage clamp 610 can function properly.

When the $V_T(i)$ voltage is stable, the conduction current or the programmed threshold voltage of the selected memory cell can be sensed via the coupled bit line 36 via the transistor 630 gated by a signal XXL. The cell current discriminator 650 serves as a discriminator or comparator of current levels. It is coupled to the sense node to sense the conduction current in the memory cell.

Figure 11B:
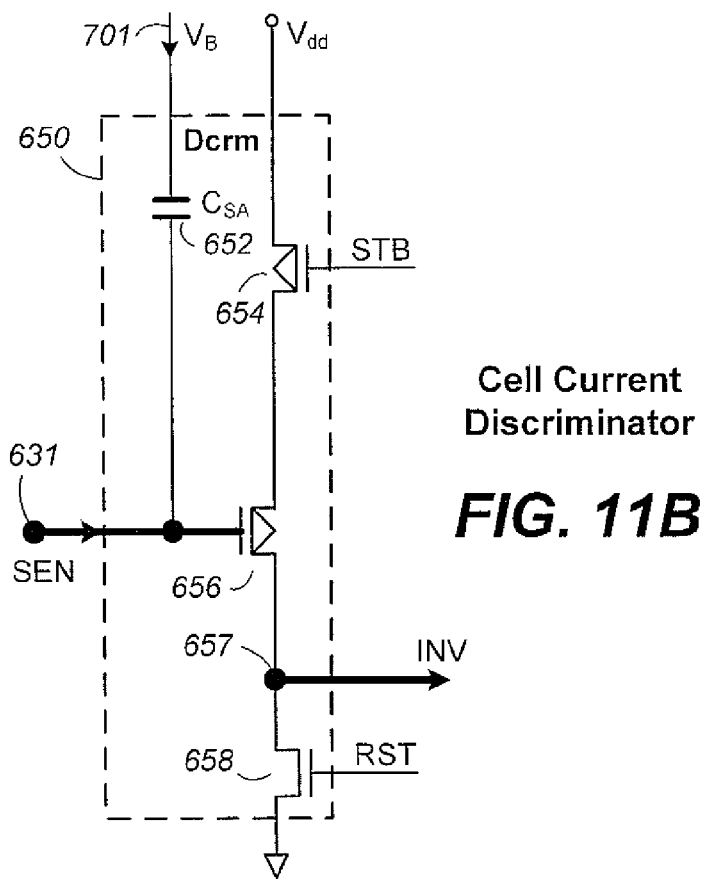
FIG. 11B illustrates in more detail the cell current discriminator circuit shown in FIG. 10.

FIG. 11B illustrates in more detail the cell current discriminator circuit shown in FIG. 10. The cell current discriminator 650' includes a capacitor 652 and a p-channel transistor 656. The cell current discriminator essentially measures the conduction current of a memory storage unit by the rate it charges or discharges the capacitor 652. This is accomplished by sensing the signal SEN at the node 631. The signal SEN controls the gate of the p-transistor 656. Prior to sensing, SEN is precharged to $V_{dd}$ (HIGH) by the precharge circuit 640'. Referring also to FIG. 10, the precharged is enabled by a signal HHL turning on the coupling transistor 632 so that the node SEN 651 is coupled to the precharge circuit at node 647. This will initially set the voltage across the capacitor 652 to be zero. Sensing is then accomplished by measuring the cell's conduction current by the rate it discharges the capacitor.

During sensing, the conduction current of the memory storage unit in the bit line will discharge the capacitor 652. The voltage in the node SEN will then decrease from $V_{dd}$ at a rate depending on the conduction current. After a predetermined discharging period, the period being corresponding to a reference current, SEN will drop to some value that may or may not turn on the measuring p-transistor 656. If it drops sufficiently low to turn on the p-transistor 656, it will mean that the conduction current is higher than the reference current. This will also result in the INV signal pulled HIGH when the signal STB is asserted. On the other hand, if the transistor 656 is not turned on at the end of the sensing period, the conduction current is lower than the reference current and the signal INV will be LOW. Referring also to FIG. 10, the end of the sensing period is marked by decoupling the bit line from the SEN node with XXL turning off the coupling transistor 630. The sensed result is then latched into the latch 650 by a strobe signal STB.

The cell current discriminator 650 effectively determines whether the cell's conduction current is higher or lower than a given demarcation current value. The given demarcation current value corresponds to a predetermined discharge time. If the sensed current is higher than the demarcation current value, the latch 660 is set to a predetermined state with the signal INV=1 (HIGH). This also means the memory cell in question has a threshold value less than the applied $V_T(i)$ at the control gate.

In general, there will be a page of memory cells being operated on by a corresponding number of multi-pass sense modules 480. A page controller 498 supplies control and timing signals to each of the sense modules. The page controller 498 cycles each of the multi-pass sense module 480 through a predetermined number of passes (j=1 to N) and also supplies a predetermined demarcation current value $I_0(j)$ for each pass. As is well known in the arts, the demarcation current value can also be implemented as a demarcation threshold voltage, or time period for sensing. After the last pass, the page controller 498 enables a transfer gate 488 with a signal NCO to read the state of the sense node 481 as sensed data to a readout bus 499. In all, a page of sense data will be read out from all the multi-pass modules 480.

Issues with High-Current Memory Cells During Sensing

As described earlier, in order to increase read performance, a page of memory cells is sensed in parallel and the larger the page, the higher the performance. However, as is evident from FIG. 9, operating a large number of cells in parallel will also consume a large amount of current.

A number of issues arise from operating with large amount of current. Generally, it is always desirable to have a device consuming less power. In particular, components having to accommodate higher current will likely be more bulky and take up valuable chip space. Often, the memory device is designed for the worse-case current while most of the time much less current is operating. This is because the current is dependent on the data programmed into the cells, with the less programmed cells having higher conduction currents.

Another issue has to do with an error introduced by a finite resistance between the source line and the ground pad of the chip. One potential problem with sensing memory cells is source line bias caused by source loading across the finite resistance. When a large number memory cells are sensed in parallel, their combined currents can result in significant voltage drop in a ground loop with finite resistance. This results in a source line bias which causes error in a read operation employing threshold voltage sensing.

Figure 12A:
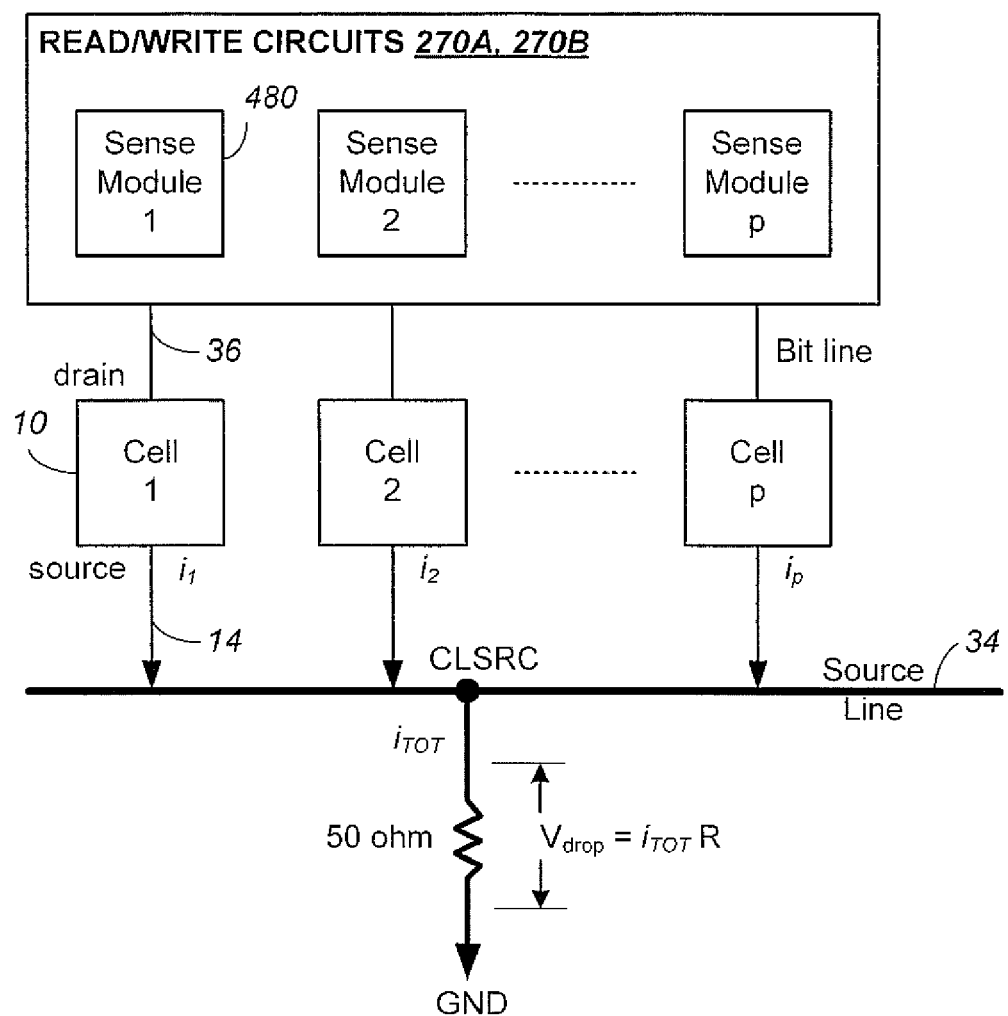
FIG. 12A illustrates the problem of source voltage error due to current flow in the source line having a finite resistance to ground.

FIG. 12A illustrates the problem of source voltage error due to current flow in the source line having a finite resistance to ground. The read/write circuits 270A and 270B operate on a page of memory cells simultaneously. Each sense modules 480 in the read/write circuits is coupled to a corresponding cell via a bit line 36. For example, a sense module 480 senses the conduction current $i_1$ (source-drain current) of a memory cell 10. The conduction current flows from the sense module through the bit line 36 into the drain of the memory cell 10 and out from the source 14 before going through a source line 34 to ground. In an integrated circuit chip, the sources of the cells in a memory array are all tied together as multiple branches of the source line 34 connected to some external ground pad (e.g. Vss pad) of the memory chip. Even when metal strapping is used to reduce the resistance of the source line, a finite resistance, R, remains between the source electrode of a memory cell and the ground pad. Typically, the ground loop resistance R is around 50 ohm.

For the entire page of memory being sensed in parallel, the total current flowing through the source line 34 is the sum of all the conduction currents, i.e. $i_{TOT}=i_1+i_2+\ldots,+i_p$. Generally each memory cell has a conduction current dependent on the amount of charge programmed into its charge storage element. For a given control gate voltage of the memory cell, a small charge will yield a comparatively higher conduction current (see FIG. 3.) When a finite resistance exists between the source electrode of a memory cell and the ground pad, the voltage drop across the resistance is given by $V_{drop}=i_{TOT}R$.

For example, if 24000 bit lines discharge at the same time, each with a current of 0.25 µA, then the source line voltage drop will be equal to 24000 lines×0.25 µA/line×50 ohms~0.3 volts. This source line bias will contribute to a sensing error of 0.45 volts when threshold voltages of the memory cells are sensed, assuming that the body effect is such that 0.3V rise in source voltage results in a 0.45V rise in threshold voltage.

Figure 12B:
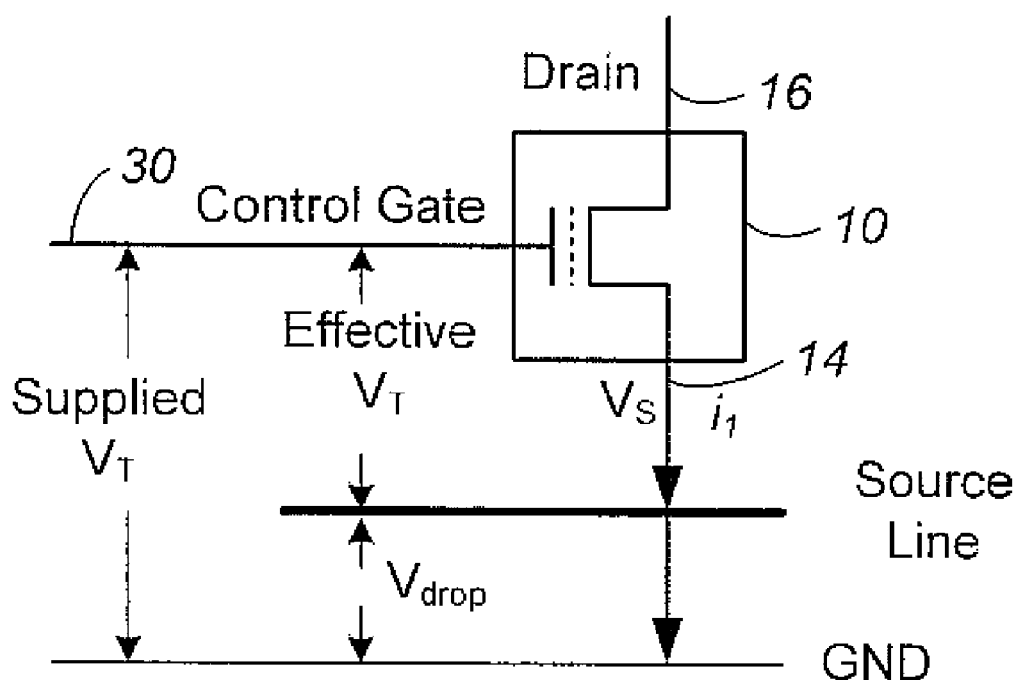
FIG. 12B illustrates the error in the threshold voltage level of a memory cell caused by a source line voltage drop.

FIG. 12B illustrates the error in the threshold voltage level of a memory cell caused by a source line voltage drop. The threshold voltage $V_T$ supplied to the control gate 30 of the memory cell 10 is relative to GND. However, the effective $V_T$ seen by the memory cell is the voltage difference between its control gate 30 and source 14. There is a difference of approximately $1.5 \times V_{drop}$ between the supplied and effective $V_T$ (ignoring the smaller contribution of voltage drop from the source 14 to the source line.) This $V_{drop}$ or source line bias will contribute to a sensing error of, for example 0.45 volts when threshold voltages of the memory cells are sensed. This bias cannot be easily removed as it is data-dependent, i.e., dependent on the memory states of the memory cells of the page.

Source-Loading and Power-Saving Techniques Using Bit-line Lockouts

Power-saving techniques have been disclosed in U.S. patent application Ser. No. 11/083,514 filed Mar. 16, 2005 by Li et al., entitled "NON-VOLATILE MEMORY AND METHOD WITH POWER-SAVING READ AND PROGRAM-VERIFY OPERATIONS", which disclosure is incorporated herein by reference. In particular, a read or program-verify operation includes one or more sensing cycles corresponding to one or more demarcation threshold voltages to determine which one of the multiple possible memory states each memory cell is in.

Each sensing cycle is for sensing relative to a demarcation threshold voltage, and operates on a page of memory cells in parallel. A sensing cycle typically includes more than one pass or sub-cycle to resolve the memory states of all the cells in the page. In one aspect, a first pass or sub-cycle senses and identifies as much as possible those memory cells among the page with the highest conduction currents. This will minimize any errors in sensing during a subsequent sub-cycle due to the presence of these high currents cells. Since these cells have already been read, their conduction currents are turned off to save power. The cells are turned off by grounding their associated bit lines so that there is substantially no potential difference across the source and drain of each cell. In a subsequent pass or sub-cycle, the remaining memory cells of the page will be sensed again in parallel with reduced interference from the higher current cells.

Thus, relative to each demarcation threshold voltage to distinguish between two adjacent memory states, at least two sensing passes are performed. The first pass or sub-cycle is to identify the high current cells with threshold voltages below the demarcation level. The second pass or sub-cycle is to repeat the sensing after having the high current cells turned off by locking out their bit lines to a ground potential.

FIG. 10 also shows a pull-down circuit 550 for the bit line 36, which is activated when both the signal INV and another signal GRS are HIGH. The pull-down circuit 550 is preferably constituted by a first n-transistor 550 in series with a second n-transistor 552. The signals INV and GRS when both are HIGH will respectively turn on the transistors 550 and 552. This will pull down the sense node 481 and also the connected bit line 36 to ground voltage. This will inhibit the conduction current flow in the memory cell 10 irrespective of the control gate voltage since there will be no voltage difference between its source and drain. Effectively, the signal GRS may be regarded as the control signal by the state machine to enable (GRS=HIGH) or disable (GRS=LOW) the bit-line lockout.

FIGS. 13(A)-13(J) are timing diagrams for a 2-pass sensing with bit line lockouts. It will be understood that in general there will be a sensing cycle for determining whether each cell in the page has a threshold voltage below or above a demarcation threshold level used to demarcate between two memory states. For each sensing cycle, there will be 2 sensing passes relative to each of the reference threshold voltages supported by the memory.

In particular, FIGS. 13(A)-13(J) are timing diagrams for signals that control the operation of the sense module 480 shown in FIG. 10. The overall scheme is to sense the page of memory cells in parallel relative to a given reference threshold level or reference conduction current. As described earlier, the sensing of the threshold voltage in a memory cell relative to a demarcation threshold level can be accomplished by determining the conduction current in the cell relative to a reference current. A cell with a threshold voltage lower than the demarcation threshold level will have its conduction current higher than the reference current. Thus, if the sensing cycles progress with a next demarcation threshold level in ascending order, then each sensing cycle will be to differentiate those cells with conduction current lower than the reference conduction current.

U.S. Pat. No. 7,196,931 discloses a method of reducing source bias error by a 2-pass sensing cycle. The 2-pass sensing cycle has the first pass identifying those cells with conduction currents substantially high than the reference current. After these cells are identified and turned off, sensing relative to substantially the reference current is performed in a second pass without the interference of the high current cells.

Each sensing relative to a reference threshold voltage therefore includes at least two sub-cycles, respectively shown as Phases (1)-(4) and Phases (5)-(9), with each sub-cycle being a pass at sensing the page of memory cells in parallel. Each sensing sub-cycle requires a setup to have the word lines and bit lines set to appropriate voltages before sensing can take place. This accomplished by a precharge operation.

The precharge operation for the first sub-cycle is between Phase (1)-(2) and that for the second sub-cycle is between Phase (5)-(6).

FIG. 13(A) shows the timing of the precharge of the selected word line. If the sensing is relative to a demarcation threshold voltage level of $V_{T1}$, the word line begins precharging to this voltage level. The word line precharge may start earlier than that of the bit lines' depending on the RC delay of the word line relative to that of the bit lines'.

The precharge of the bit lines can take place with or without the memory cells coupled to the bit lines. As described earlier, in one embodiment, the cells are initially decoupled from the bit lines so that their drain currents do not work against the pull up of the bit lines This is accomplished by connecting the precharge circuit to the bit line via the isolation transistor 482 with the signal BLS HIGH (FIG. 13(E)) and cutting off the NAND chain to the source with SGS LOW (FIG. 13(F)). The precharge/clamp circuit 640 (see FIG. 10) is coupled in by turning on the signal HHL to HIGH (FIG. 13(B)). In this way, the bit lines will start to get pulled up (e.g., FIG. 13(H1) and 13(I1)). When the bit lines have been charged up close to their targeted value, Phase (2) of the bit-line precharge will commence. In Phase (2), the precharge continues, but with the cells coupled to the bit lines in order to allow the bit lines voltage to be stabilized under the condition for sensing. The total precharge period during the first pass of sub-cycle is denoted by a precharge period 700.

This embodiment with the bit line initially decoupled from the cell is only preferable if after coupling is allowed it does not incur a long waiting period for the bit line voltage to stabilize. In other words, this embodiment is preferable if the waiting period is shorter than the settling time for the case where the bit line is coupled to the cell right at the beginning of the bit line precharge operation. Otherwise, it will be more preferable to have another embodiment in which Phase (1) is not performed and the bit-line precharge simply starts with Phase (2) where the bit lines are precharged against the conduction current of the cells.

Sensing takes place in Phase (3). As described earlier, in the first sensing sub-cycle, the high current cells are identified. Thus, the sensing is relative to a reference threshold which may be at a margin from that to be used in the next sensing sub-cycle. In other words, the first sub-cycle may use a demarcation current at a margin above that of next sub-cycle. In one embodiment, this is accomplished by shortening the discharge time of the capacitor 652 in the cell current discriminator 650 (see FIG. 11B) of the sense module 480 (see FIG. 10). The signal HHL controls the transistor 632 (see FIG. 10) that couples or decouples the precharge circuit to the SEN node and therefore the cell current discriminator 650. On the other hand, the signal XXL controls the transistor 630 that couples or decouples the bit line from the SEN node. At the beginning of Phase (3), the signal HHL becomes LOW (FIG. 13(B)), thereby terminating the precharge and the conduction current of the cell will discharge the capacitor 652. The end of the discharging period is controlled by XXL going LOW at the end of Phase (3), thereby cutting off the current by decoupling the bit line from the SEN node. It can be seen from the cell current discriminator 650 shown in FIG. 11B that a demarcation current level to be discriminated upon is related to the discharge time, with a longer discharge time yielding a smaller demarcation current level.

In Phase (4), the voltage of the discharged capacitor is then compared relative to the threshold voltage of the p-transistor 656 (see FIG. 11B) and the result is latched by the strobe signal STB. The increase margin described above is then accomplished by shortening the sensing period in Phase (3). In this way, only the highest currents will have been able to discharge the capacitor in the shortened period to trip the p-transistor 656.

After the first sub-cycle has identified the high current cells, they are then latched and turned off before the next sensing. This is accomplished by virtue of those high current cells having a sensed result of INV=HIGH. For example, in FIG. 13, the cell coupled to bit line BL1 has a conduction current of about 120 nA (see FIG. 13(H1)) which is below the demarcation threshold current. This relatively smaller current will be able to discharge the capacitor 652 sufficiently to reduce the voltage at SEN (see FIG. 11B) to turn on the p-transistor 656 so that the signal INV (shown as INV1 in FIG. 13(H2)) does not get pulled up to HIGH when the strobe STB signal is asserted. Thus, the cells with relatively smaller currents will have INV=LOW.

Figure 13:
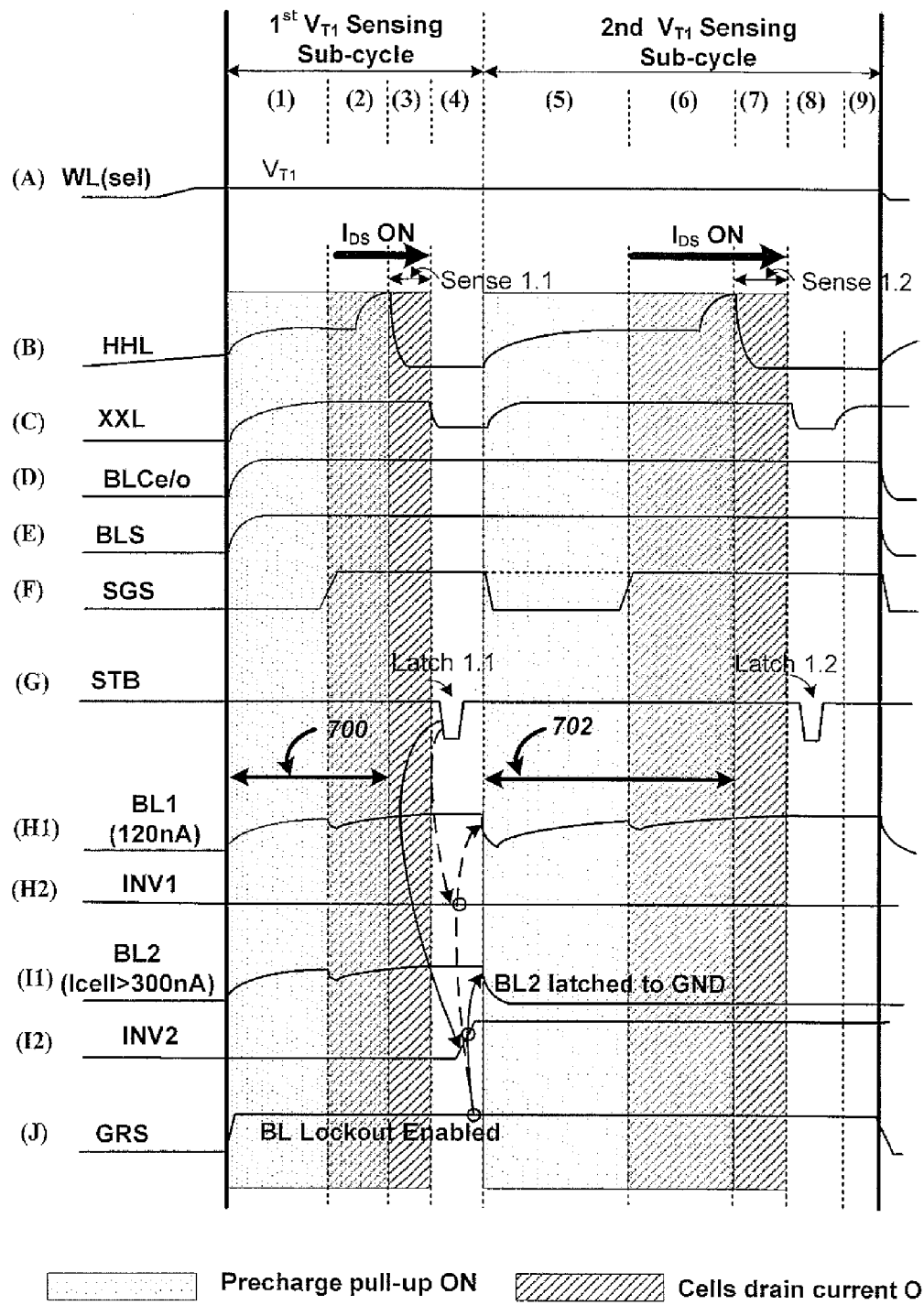
FIG. 13 is timing diagrams for a 2-pass sensing with bit line lockouts.

On the other hand, the cells with the relatively larger currents (e.g., greater than 300 nA, see FIG. 13(I1)) will have the signal INV (shown as INV2 in FIG. 13(I2)) latched at HIGH. This is used to activate the pull-down circuit 550 shown in FIG. 10. When the pull-down circuit is enabled by the GRS signal HIGH (FIG. 13(J)), then whenever INV is HIGH, the pull-down circuit 550 will pull the bit line via the enabled isolation transistor 482 (see FIG. 13(E)) to ground. Thus, the bit lines of the cells sensed to have relatively larger currents will be locked out to ground, thereby shutting down those cells.

In the second pass of the sensing or the next sensing sub-cycle as represented by Phases (5)-(9), the process is similar to the first sub-cycle. The precharge period 702 takes place in Phases (5)-(6). The sensing in Phase (7) takes place after the voltages in the bit lines have stabilized with the displacement currents decayed to some insignificant value. The strobing and latching take place at Phase (8) and any other high current states missed in the first pass will also have their associated bit lines lockout to ground similar to that shown in FIG. 13(I2) in previous Phase (4). In Phase (9), the sensed results in the form of the signal SEN which is essentially the inversion of the signal INV will be transferred out via the readout bus.

Turning off those cells irrelevant to the current sensing by locking out their bit lines to ground will help to reduce the total current $i_{TOT}$ (see FIG. 12A). This has two benefits. First it will save power. Secondly, it will reduce the source's (CLSRC) ground loop bias error as $V_{drop}$ is reduced with $i_{TOT}$. Thus, existing sensing techniques have been implementing this two-pass sensing relative to every memory state.

FIG. 14 illustrates schematically an example of applying the existing two-pass sensing scheme on the 8-state memory shown in FIG. 8. The 8-state memory is demarcated by at least 7 demarcation threshold voltage levels, namely $D_A$, $D_B$, $D_C$, $D_D$, $D_E$, $D_F$ and $D_G$. Thus, there will be at least as many sensing cycles, each associated with one of these demarcation threshold voltage levels. For example, $D_A$ demarcates between memory states "Gr" and "A", $D_B$ demarcates between memory states "A" and "B", etc. During each sensing cycle, the demarcation threshold voltage level will be applied to the selected word line.

Each sensing cycle will further have two passes. The first pass includes a "pre-sensing" followed by a lockout of detected high-current bit lines. The pre-sensing will sense and identify the high current states having threshold voltages below the applied demarcation threshold voltage level. The bit lines associated with these identified high current cells will be locked out by latching to ground. With the high current states removed, the second pass will be able to sense more accurately. Also, any high current states not identified in the first pass will be properly identified and also locked out. In this way, the cells will be sensed accurately to have data as either below or above the applied demarcation threshold voltage level.

In order to distinguished all the possible memory states, the page of memory cells are sensed relative to every demarcation threshold level in turn. As the demarcation threshold level moves to a higher value in the threshold window of the cells, more of the cells in the page will likely be identified as having higher current (with threshold voltages below the demarcation threshold voltage level) and therefore more bit lines of the page will be locked out.

As described earlier, the bit line lockout is accomplished by the pull-down circuit 550 shown in FIG. 10. In the existing two-pass sensing scheme, the pull-down circuit 500 is always ready to be pulled down whenever the latched signal INV is HIGH. In the pull-down circuit 550 shown in FIG. 10, the circuit is enabled by having the signal GRS always HIGH so that the n-transistor 552 always provides a connection to ground.

Issues with Performance and Power Due to Bit-line Lockouts

U.S. Pat. No. 7,196,931 has prescribed that by using bit-line lockouts to turn off the cells that have been sensed or are no longer relevant in the current sensing, the two-pass sensing scheme helps limit the maximum current involved and also provides more accurate sensing in the second pass due to reduced source's ground loop bias errors. However, any advantage is offset by reduction in performance due to multiplicity of sensing passes and the noises generated by the bit-line lockout operations.

Grounding selective bit lines among the bit lines in the memory array has repercussions due to the capacitance between the bit lines. The capacitance between bit lines becomes increasingly significant with higher and higher density integrated circuits. The bit-line to bit-line capacitance can be even higher for memories with the so-called "all-bit-line" ("ABL") architecture mentioned earlier. The page in an all-bit-line architecture is formed by a contiguous run of memory cells along a row. The ABL's bit-line to bit-line capacitance may be higher if the memory planes are longer along the bit line direction. Generally, in both ABL and conventional architecture, bit line to neighbor bit line distance is the same. In the conventional case, half the bit lines are precharged while their nearest neighbors stay grounded which is the worse case scenario for being faced with all the bit line to bit line cross talk capacitance. In ABL, they are all charge together, but then discharged at different times.

Since the bit lines (and word lines) behave as capacitive loads, when a bit line is being precharged or discharged, there are two undesirable effects associated with the bit-line lockout scheme.

First, many of the bit lines will be locked at ground potential while the others are being pulled up during precharge to a higher potential. Due to the bitline-bitline capacitance, it will in general be harder and will have to expend more power to precharge the bit lines amidst a background of anchored, grounded bit lines as compared to pulling all bit lines in the page up together without forcing some to be grounded.

Secondly, an alternating current ("AC") displacement current will flow initially and eventually decay to zero as the bit line becomes charged to the applied voltage. The decay time is a function of the RC constant of the bit lines where C is the effective capacitance. Since sensing a cell is essentially to determine its direct current ("DC") conduction current, accurate sensing in the bit line can only commence after the AC displacement current has subsided.

A substantial part of the AC displacement current flowing in the bit line being sensed can be regarded as coming from charging the bit line to nearest bit lines capacitance as the majority of each bit line's total capacitance is composed of each bit line's capacitance to its two neighbors residing on its sides. Each bit line or each electrode's capacitance is equal to the sum total of that electrode's capacitance to all its neighbors. If all capacitances to all neighbors are substracted, then nothing is left. About 90% of each bit line's total capacitance is to its first, second, and third nearest neighbors. This leaves a little over 10% of the bit line capacitance being to the layers above or below.

If all bit lines are charged at the same time and later discharged at the same time then the effective capacitance per bit line is only about 10% of each bit line's total capacitance. If they are all charged at the same time but during various sensing operations they are brought down to ground at various times, then the effective bit line capacitance that has to be fought is much higher and may vary from bit line to bit line depending on whether the bit line was locked out at the same time or at a different time with respect to its neighbors. Since there are many different occasions for the bit lines to be locked out, the chances that a bit line is locked out at the same time that its neighbors are locked out can be low.

When charging up the bit lines all at the same time the energy expended is $C \times V^2$ where $\frac{1}{2} \times C \times V^2$ is stored as electric field in the dielectrics between capacitor electrodes, and another $\frac{1}{2} \times C \times V^2$ is energy converted into heat that was burned across the internal resistance of the power supply that delivered the energy. This second term is independent of the internal resistance value of the voltage/power source. As long as all bit lines are charged up in unison, the C in all these expressions is the effective C which is only about 10% of each bit line's total capacitance as explained earlier. However, when bit lines are locked out at different times from their neighbors (which occurs quite often) then the power supply does not have to deliver any more energy to the bit lines being brought down to ground. Only it has to supply energy to the neighbor bit lines which are to be maintained at the bit line voltage but are being pulled down capacitively by neighbors that are being forced to ground. For bit lines that are to be maintained at their bit line voltage while their neighbors are being brought down to ground, the entire bit-line to bit-line capacitance is engaged. The bit lines that are being grounded will have the energy stored in the electric fields of their surrounding dielectrics converted into heat that is dissipated along the resistive path to ground.

Figure 15:
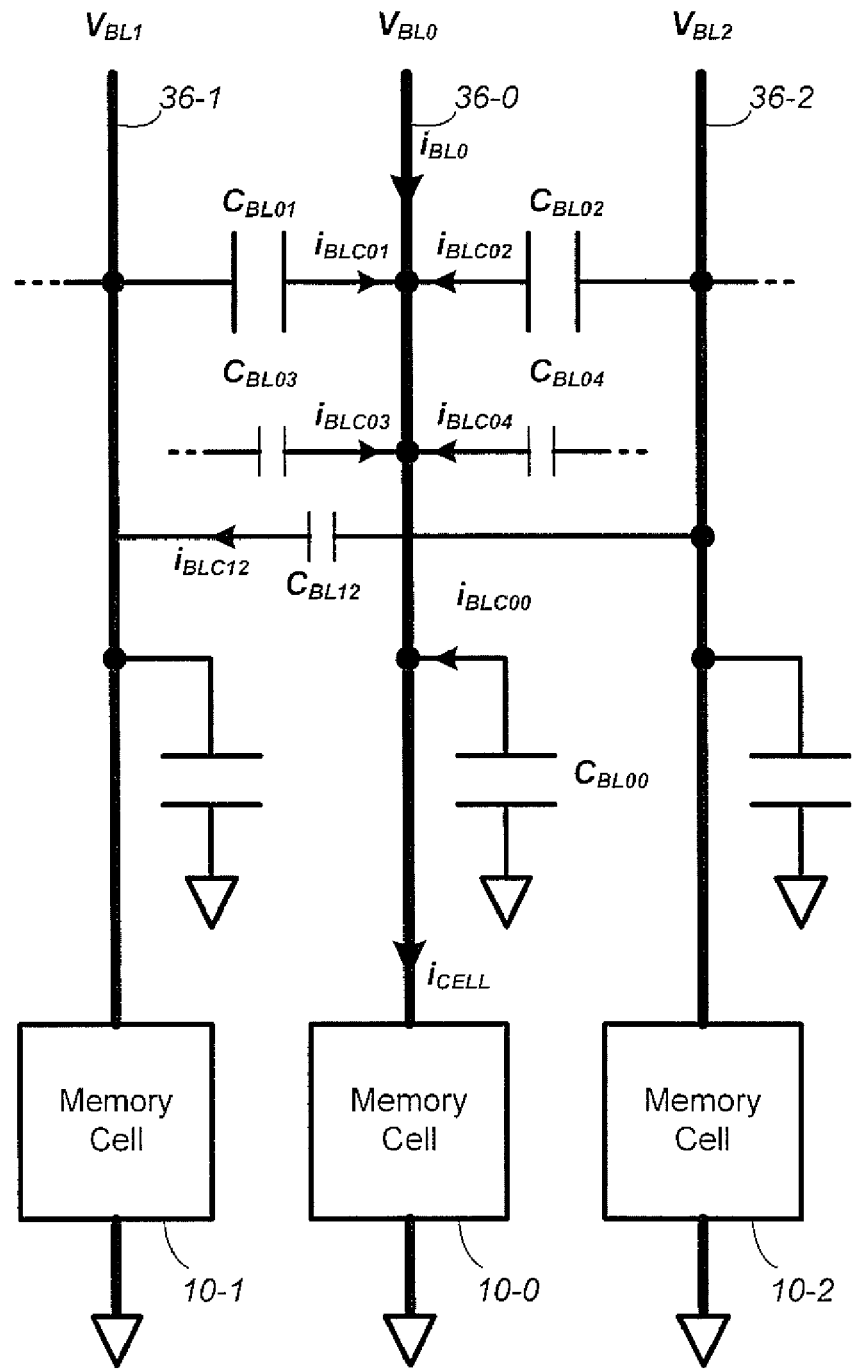
FIG. 15 illustrates three adjacent bit lines and the effect of capacitive couplings between them.

FIG. 15 illustrates three adjacent bit lines and the effect of capacitive couplings between them. A memory cell 10-0 has two adjacent memory cells, 10-1 and 10-2. Similarly, coupled to the three memory cells are respectively three adjacent bit lines 36-0, 36-1 and 36-2. Each bit line's self capacitance consists of the sum of its capacitances to all other electrodes such as its pair of first nearest neighbors, its pair second nearest neighbors, its pair of third nearest neighbors, etc., in addition to its capacitance to electrodes that reside above or below it. FIG. 15 depicts not all capacitances mentioned above but the biggest ones that are of most consequence.

It can then be seen, there could be various branches of current flow due to the various capacitances. In particular, the currents due to each bit line self capacitance will result in:

$$i_{BL0} = C_{BL01} d/dt(V_{BL0} - V_{BL1}) + C_{BL02} d/dt(V_{BL0} - V_{BL2})$$

neglecting the effect of second, third and further neighbors and the effect of electrodes in layers above or below the bit line of interest. If all bit lines are charged up together then the expression above is zero, and the displacement current will be due to the neglected term corresponding to the capacitance between the bit line of interest and electrodes in layers above or below it to the extent that their voltage is not being moved in tandem with that of the bit line of interest.

The cell current given above is an approximation since it only includes contributions from adjacent bit lines. In general, for the bit line BL0 there will also be capacitance $C_{BL03}$ due to the non adjacent bit lines to the left as well as capacitance $C_{BL04}$ due to the non adjacent bit lines to the right. Similarly, there will be a mutual capacitance $C_{BL12}$ between non adjacent bit lines BL1 and BL2. These capacitances will contribute to displacement current flow dependent on a varying voltage across each capacitor.

The total bit line current is then composed of the sum of the displacement current and the conduction current. The sense amp has to provide positive conduction current going into the bit lines and passing through the cell and then going to ground. Also, on bit lines whose neighbors are being brought down to ground, the sense amps have to provide additional positive current in order to fight the resulting displacement current. The bit lines being brought down to ground are simply grounded and no power from sense amp or any other supply is required for bringing an electrode to ground.

As for charging the cross-coupling capacitance, the displacement current will depend on the rate of change of the voltage difference between the bit lines. The rate of change of the voltage difference may come from the different rates of charging or discharge between the bit line and its neighbors.

During precharge, as described earlier, the bit line coupled to a more conducting cell will require more net current for voltage charging and may therefore charge up slower compared to a neighbor with a less conducting cell. Thus, when the bit line and its neighbors have similar memory states and therefore similar conducting currents, they will all charge up at similar rates and have similar voltages at any given time. In this case, the voltage difference across the cross-coupling capacitance will be relatively small and likewise will the associated displacement current be. Also, by lowering the bit line voltage, not only less energy is required to charge up the capacitances involved, but also the maximum conduction current is linearly reduced. The desirable effect is that a sense amplifier with a fixed strength can easily maintain the charging ramp rate of all bit lines despite the fact that some are connected to non-conducting cells while others are connected to conducting cells.

In the preferred embodiment, the bit line voltages of the plurality of bit line coupled to the plurality of memory cells are controlled such that the voltage difference between each adjacent pair of lines is substantially independent of time while their conduction currents are being sensed. When this condition is imposed, all the currents due to the various bit line capacitance drop out since they all depend on a time varying voltage difference. Thus, from the equation above, since $[i_{BLC00} + i_{BLC01} + i_{BLC02}] = 0$, the current sensed from the bit line is identical to the cell's current, e.g., $i_{BL0} = i_{CELL}$.

The largest displacement current will occur when the cells associated with the bit line being sensed and its neighbors have different memory states. For example, the bit line being sense is coupled to a non-conducting memory cell when its neighbors are coupled to cells that are highly conducting. In general, there will be a distribution in the range of displacement currents and its decaying life times. This means that the precharge recovery operation must take place over a predetermined period that extends beyond the worse case recovery time to the extent that displacement current has decayed to a predetermined level before the bit line will be considered stable for accurate sensing.

In the 2-pass sensing scheme, the precharge period 702 for the second pass is further increased if some of the adjacent bit lines are locked out at the end of the first pass. In the bit-line lockout scheme, the identified high current cells have their bit lines latched to ground just prior to the precharge for the second pass. The rate of change of the voltage difference is extreme with some bit lines being pulled rapidly from a previously precharged level to ground potential while others are maintained substantially at the precharged potential. This will cause a significant displacement current in the bit lines where the next sensing is to take place. The precharge period must be sufficiently long for all the displacement currents to decay away before accurate sensing can take place. Thus, with the bit-line lockout scheme, after every lockout operation, more time must be provided for the bit line voltage to stabilize before sensing can take place. Referring again to FIG. 14, this delay between each lockout and the next sensing occurs twice in each sensing cycle relative to a demarcation threshold level. For multi-level memories, the delay is further compounded at each demarcation threshold level. For example, for the 8-state memory, there will be fourteen delay periods (2 delay periods for seven read levels that will distinguish between 8 states) due to the effects of bit-line lockouts, causing serious degradation in performance.

Sensing with Selective Enabling of Bitline Lockout

According to a general aspect of the invention, when a page of memory cells is being sensed in parallel, the instance of a bit-line lockout, which is the grounding of a bit-line to shut down a memory cell exceeding a predetermined current level, is reduced to a minimum. In this way, additional sensing sub-cycles to identify and shut down the high-current cells are skipped as much as a given budget for current consumption would allow, and sensing at a selective number of sensing control gate voltages will result in bit lines that are detected to correspond to ON cells to shut down, while sensing at other control gate voltages will not result in any such bit line shut down operation. Through the application of this technique the performance of the sensing operation is improved by reducing the number of sensing sub-cycles as well as reducing the noise generated due to bit-line-to-bit-line coupling when shutting down the bit lines. In this context, bit-line-to-bit-line coupling refers to the capacitive couplings that exist between neighbor global bit lines.

In a preferred embodiment, the bit-line lockout is implemented by a pull-down circuit which is capable of pulling the bit line to ground. The pull-down circuit comprises two pass gates in series between the bit-lines and the ground. The two pass gates form an AND gate with one pass gate controlled by a pull-down enabling or disabling control signal and the other pass gate controlled by whether the cell in question is sensed to have a current higher or lower than a reference current. When the pull-down circuit is disabled, the bit line will not be grounded irrespective of the sensed result. When the pull-down circuit is enabled, the bit line will be pulled to ground when the sensed result is from a high current memory cell.

FIGS. 16(A)-16(J) are timing diagrams for signals that control the operation of the sense module incorporating selective bit-line lockout. Essentially, the sense module 480 shown in FIG. 10 has the bit-line lockout feature enabled or disabled by the control signal GRS. The signal GRS is supplied by the state machine 112 (see FIG. 1.) When the signal GRS is HIGH, the pull-down circuit 550 (see FIG. 10) is enabled. Conversely, when GRS is LOW, the pull-down circuit 550 is disabled. In that respect, the timing diagrams shown in FIGS. 13(A)-13(J) earlier refer to the case when the bit-line lockout is enabled with the signal GRS always at HIGH (FIG. 13(J).) On the other hand, the timing diagrams shown in FIGS. 16(A)-16(J) refer to the case when the bit-line lockout can be selectively disabled with the signal GRS at LOW (FIG. 16(J).)

In some embodiments, when the bit-line lockout is enabled, it is preceded by a sensing sub-cycle in order to determine the high current cells to lock out. On the other hand, when the bit-line lockout is selectively disabled, its preceding sensing sub-cycle for determining the high current cells will also be skipped.

FIGS. 16(A)-16(J) are timing diagrams illustrating two sensing cycles, respectively relative to two consecutive demarcation threshold levels, during which bit-line lockout is selectively disabled. Thus, unlike the case when bit-line lockout is enabled, each cycle comprises a 1-pass sensing.

With regard to the 1-pass sensing relative to $V_{T1}$, the precharge of the selected word line to VT1 takes place either before or contemporaneously with the precharge of the bit lines. In particular, the bit-line precharge period takes place in Phases (1.5)-(1.6). The sensing in Phase (1.7) takes place after the voltages in the bit lines have stabilized with any displacement currents decayed to some insignificant value. The strobing and latching take place at Phase (1.8) where "high" current cells with threshold voltage below $V_{T1}$ has the signal INV latched as HIGH, and cells with threshold voltage above $V_{T1}$ has INV latched as LOW. In Phase (1.9), the sensed results in the form of the signal SEN which is essentially the inversion of the signal INV will be transferred out via the readout bus.

Figure 16:
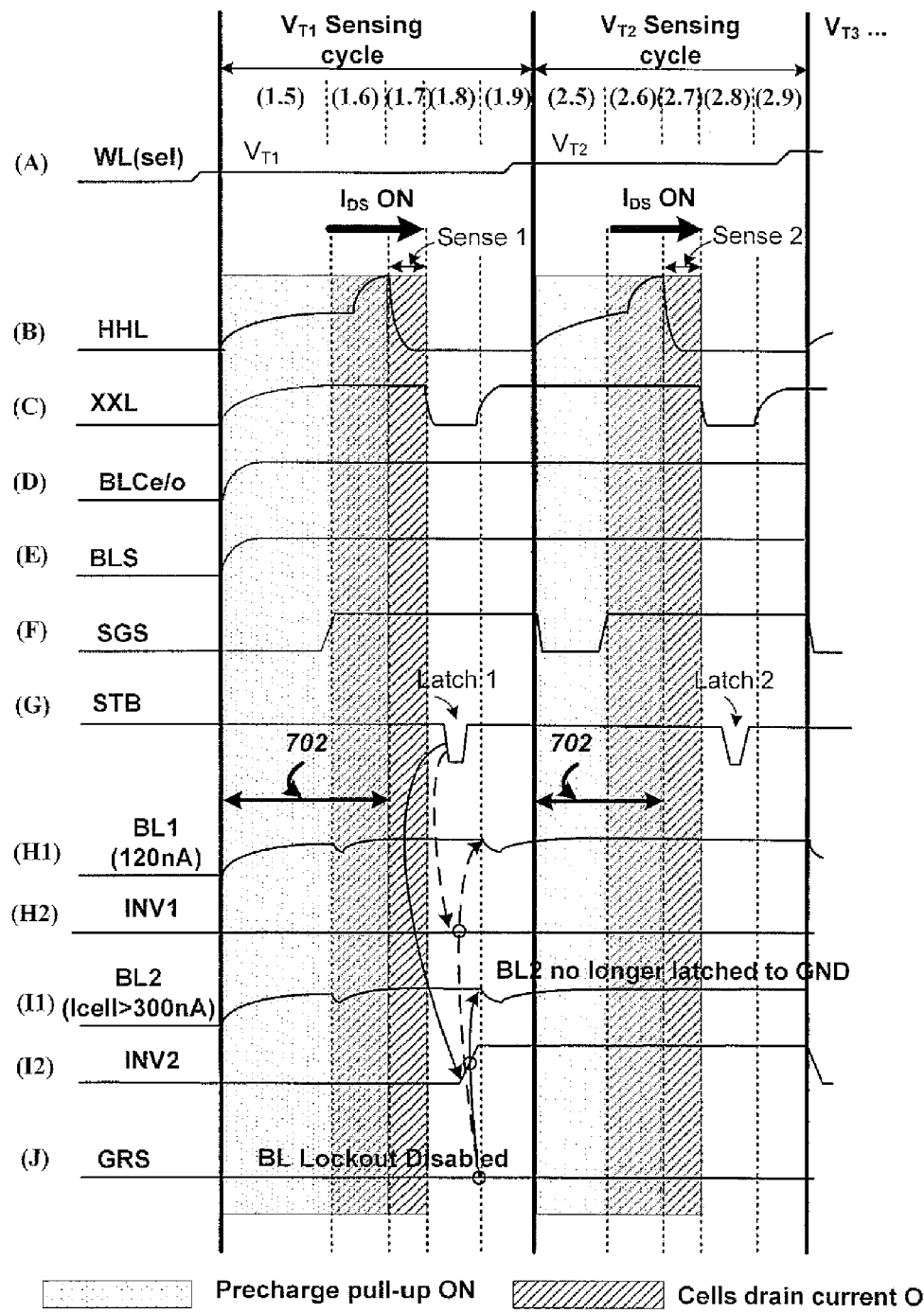
FIG. 16 is timing diagrams for signals that control the operation of the sense module incorporating selective bit-line lockout.

It will be seen from FIG. 16(J) that the signal GRS is LOW for both sensing cycles so that the pull-down circuit 550 (FIG. 10) for each bit line is disabled irrespective of the sensed value of INV. This means even for the high current cells with threshold voltage below $V_{T1}$ (see FIGS. 16(I1) and 16(I2)), their bit lines will not be locked out by being pulled to ground.

To limit the page current and source bias error, the bit-line lockout scheme is used to turn off the high-current cells by locking out their bit lines to ground insofar as they are no longer relevant to the next sensing pass to be performed. Thus, existing sensing techniques have been implementing the two-pass sensing with bit-line lockout relative to every memory state.

It has also been explained that the disadvantage of the two-pass sensing is that it can greatly impact the sensing performance. Performing two-pass sensing will double the number of sensing passes, thereby prolonging the sensing operation by about twofold relative to the single-pass sensing. In practice, the delay is much longer owing to the need to manage the transient noise generated from latching bit lines to ground. As described earlier, a significant amount of displacement current is induced as noise into a bit line whose current is being sensed. The displacement current is due to the rate of change of voltages between neighboring bit lines due to their mutual capacitance. Thus, the bit-line precharge period of the sensing cycle is substantially prolonged in order to wait until the displacement current decays away. During this delayed period, the memory cell is coupled to the bit line and therefore additional power is drained with the precharge circuit pulling up the bit line while the cell's conduction current is working against it.

By not performing bit-line lockout of detected high current cells, only 1-pass sensing is needed and furthermore the bit lines are not pulled to ground. Noises will be minimized and the bit-line precharge period needs not be prolonged. This is illustrated schematically by the shortened precharge period 702 of Phase (2.5) in the $V_{T2}$ sensing cycle shown in FIG. 16. In fact, it has been estimated that the overall ON period of the cells are shortened resulting in power-saving.

With reduced number of bit-line lockouts to improve sensing performance according to the present invention, more of the high current cells will remain in the ON state to contribute to the source bias error as described earlier in connection with FIGS. 12A and 12B. One solution to minimize the error in spite of high level of $i_{TOT}R$ is to reference all voltages to the control gate and drain of individual memory cells referenced to a node as close as possible to the sources of the memory cells. For example, as shown in FIGS. 12A and 12B, the reference point can be taken at the source line 32 rather than ground so as to minimize the ground loop resistance. Techniques for minimizing the source bias error have been disclosed U.S. Pat. Nos. 7,170,784 and 7,173,854, and U.S. patent application Ser. No. 11/739,501, filed: Apr. 24, 2007, entitled "COMPENSATING SOURCE VOLTAGE DROP IN NON-VOLATILE STORAGE" by Sekar et al, the entire disclosure of which are incorporated herein by reference.

In one implementation of sensing a multi-state memory involving multiple sensing passes for the page of memory cells relative to each of the multiple states, the step of locking out of the bit lines associated with memory cells identified with higher than the predetermined current level is only implemented at predetermined sensing passes. In this way, the benefit of bit-line lockouts to reduce the total current and source bias error is balanced against the negative effects of longer sensing time due to more sub-cycles and longer waiting time for the generated noise to subside. By selectively reducing the number of lockouts, these negative effects resulting in lower sensing performance and higher power consumption are alleviated.

FIG. 17A illustrates one exemplary schedule for selectively enabling bit-line lockout among the multiple passes of a multi-state sensing operation. The example relates to the 8-state memory shown in FIG. 8. In order to resolve all the possible eight states, the page of memory cells will have to be sensed in at least 7 sensing cycles, each one with a different demarcation threshold level, such as $D_A$ or $D_B$, ..., etc. Two-pass sensing is implemented in each sensing cycle. However, the difference with the existing two-pass sensing (see FIG. 14) is that the bit-line lockout operation will be disabled for the second pass. In other word, the bit-line lockout operation will be skipped every other sensing pass. In particular, the bit-line lockout operation will be skipped after the sensing in the second pass. While the number of passes is the same as existing two-pass sensing, bit-line lockout operation is reduced by 50 percent. In this case, less noise will be generated after the second pass and allows the first pass in the next cycle to have a shortened bit-line precharge period. This embodiment may not increase performance significantly if the word line stabilization time is of the same order as the bit line to bit line cross talk recovery time, since the bit line lockout and recovery from it can be simultaneous with word line voltage stabilizing at the next sensing level.

Figures 17B, 17C:
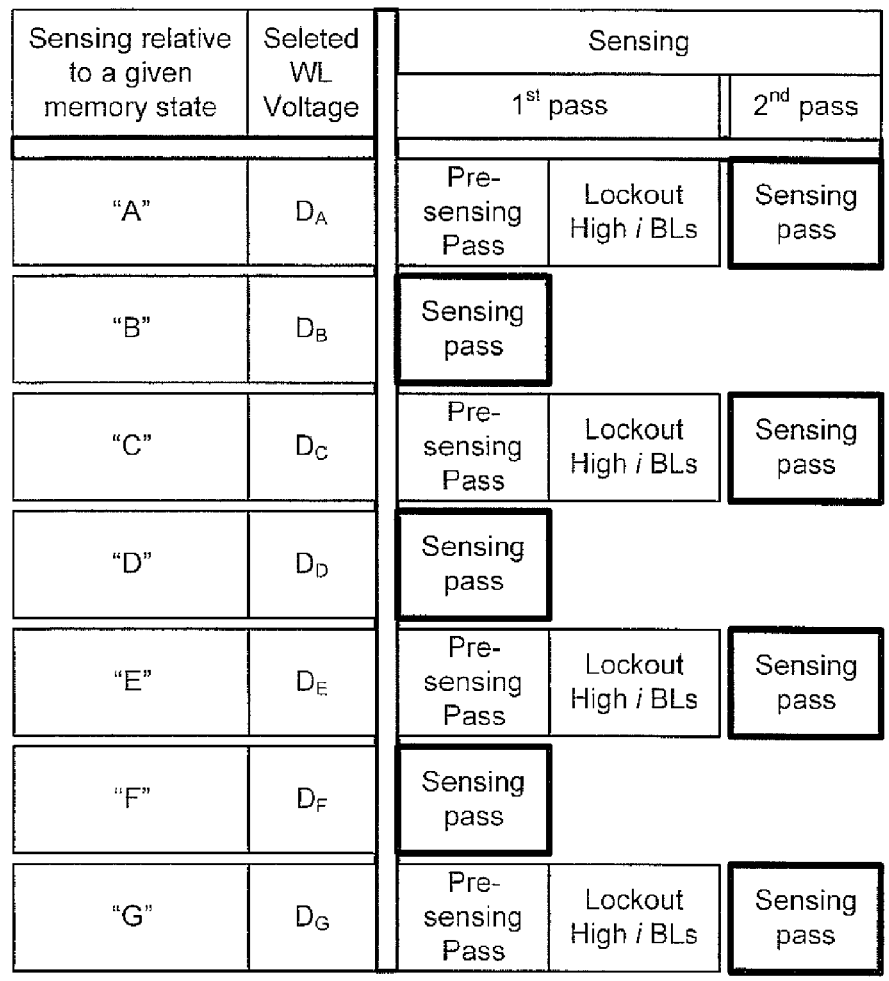
FIG. 17B illustrates another exemplary schedule for selectively enabling bit-line lockout among the multiple passes of a multi-state sensing operation.
FIG. 17C illustrates a page of memory cells storing pseudo-randomized data.

FIG. 17B illustrates another exemplary schedule for selectively enabling bit-line lockout among the multiple passes of a multi-state sensing operation. The example also relates to the 8-state memory shown in FIG. 8 and is similar to the example shown in FIG. 17A except the two-pass sensing will be implemented in every other sensing cycle. In the cycle with one-pass, only the sensing operation will be performed and the pre-sensing and bit-line lockout operations will be skipped. In this case, the number of passes is reduced by 50 percent and the number of bit-line lockout operations is reduced by 75 percent.

FIG. 17C illustrates a page of memory cells storing pseudo-randomized data. To ensure uniform distribution of high-current states among a page, the page is preferably coded so that data are stored across the page with relatively even distributions among all possible memory states. In a preferred embodiment, the data is coded across the page to appear pseudo-randomly distributed among the possible memory states. In this way, it is possible to estimate statistically the amount of current in the memory system based on the number of skipped bit-line lockout operations.

According to another aspect of the invention, the reduction of bit-line lockouts is commensurate with the total current flowing in the page of memory cells not exceeding a predetermined maximum current. Conversely, the bit-line lockout operation is invoked when the total current, which is data dependent, appears about to exceed a predetermined current level. In this way, the bit-line lockout operation can be minimized without the system exceeding a peak current.

In one implementation of sensing a multi-state memory involving multiple sensing passes for the page of memory cells relative to each of the multiple states, the step of locking out of the bit lines associated with memory cells identified with higher than the predetermined current level is only implemented at a sensing pass when the total current flowing in the page of the memory cells is about to exceed the predetermined maximum current. In one embodiment, a current monitor is provided to monitor the total current flowing in the page of memory cells.

Figure 18:
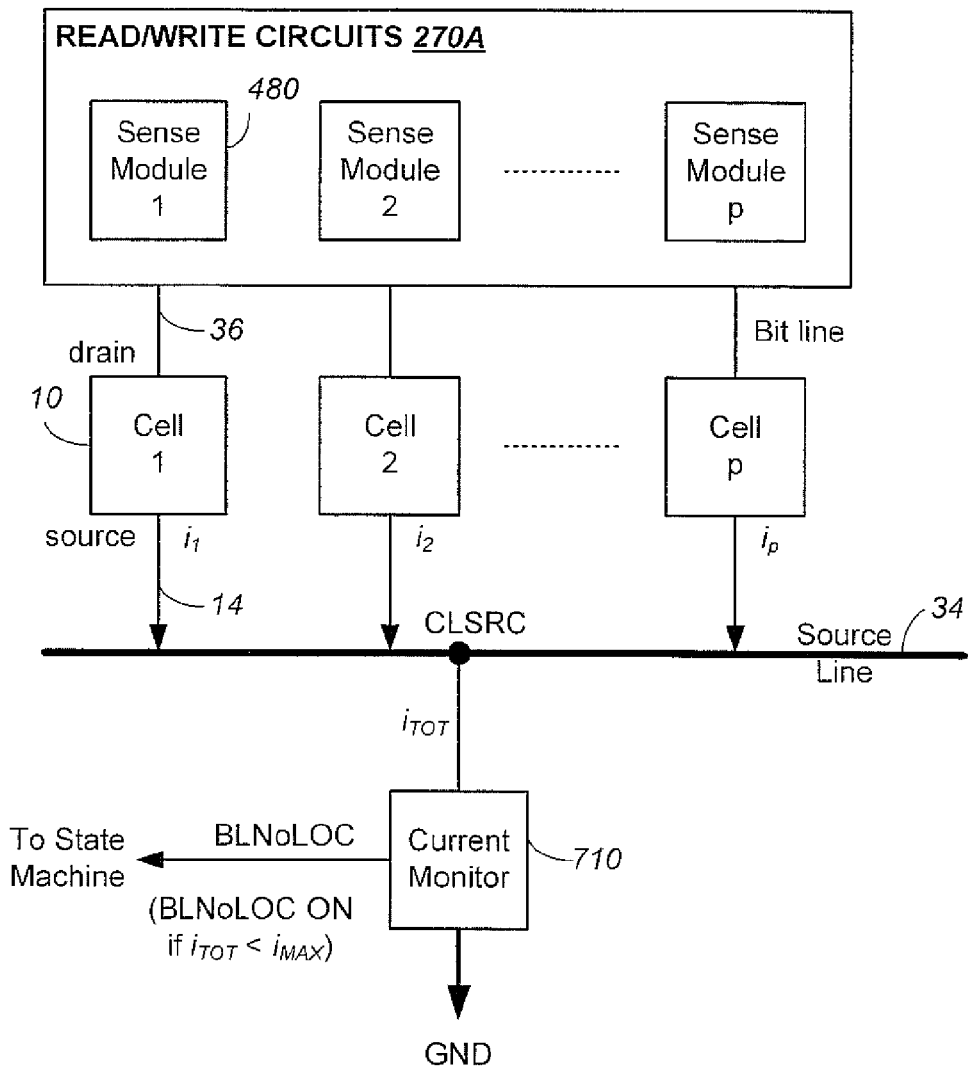
FIG. 18 illustrates the bit-line lockout operation being responsive to a monitored current of the memory system.

FIG. 18 illustrates the bit-line lockout operation being responsive to a monitored current of the memory system. FIG. 18 illustrates the current flowing in a page of memory cells being sensed by corresponding sense modules in the read/write circuits 270A similar to that shown in FIG. 9. A current monitor 710 is positioned at a path where the sum of the currents from the individual memory cells of the page is aggregated. For example, it is placed in the conduction path between the source line 34 and the system ground. In one embodiment, the current monitor is implemented as a voltage monitor across a resistor so that the monitored current is given by the voltage drop divided by the resistance similar to that shown in FIG. 12A. The current monitor 710 preferably includes logic to provide a signal BLNoLOC to the state machine 112 (see FIG. 1.) Whenever the monitor current $i_{TOT}$ is below a predefined level $i_{MAX}$, BLNoLOC is output HIGH. In response to BLNoLOC being HIGH, the state machine will cause the sensing to execute with bit-line lockout disabled, with the control signal GRS becoming LOW (see FIG. 10). Otherwise, when $i_{TOT} > i_{MAX}$, BLNoLOC will be output LOW and this signals the state machine to operate the sensing with bit-line lockout enabled in order to shut down the current of some memory cells.

Figure 19:
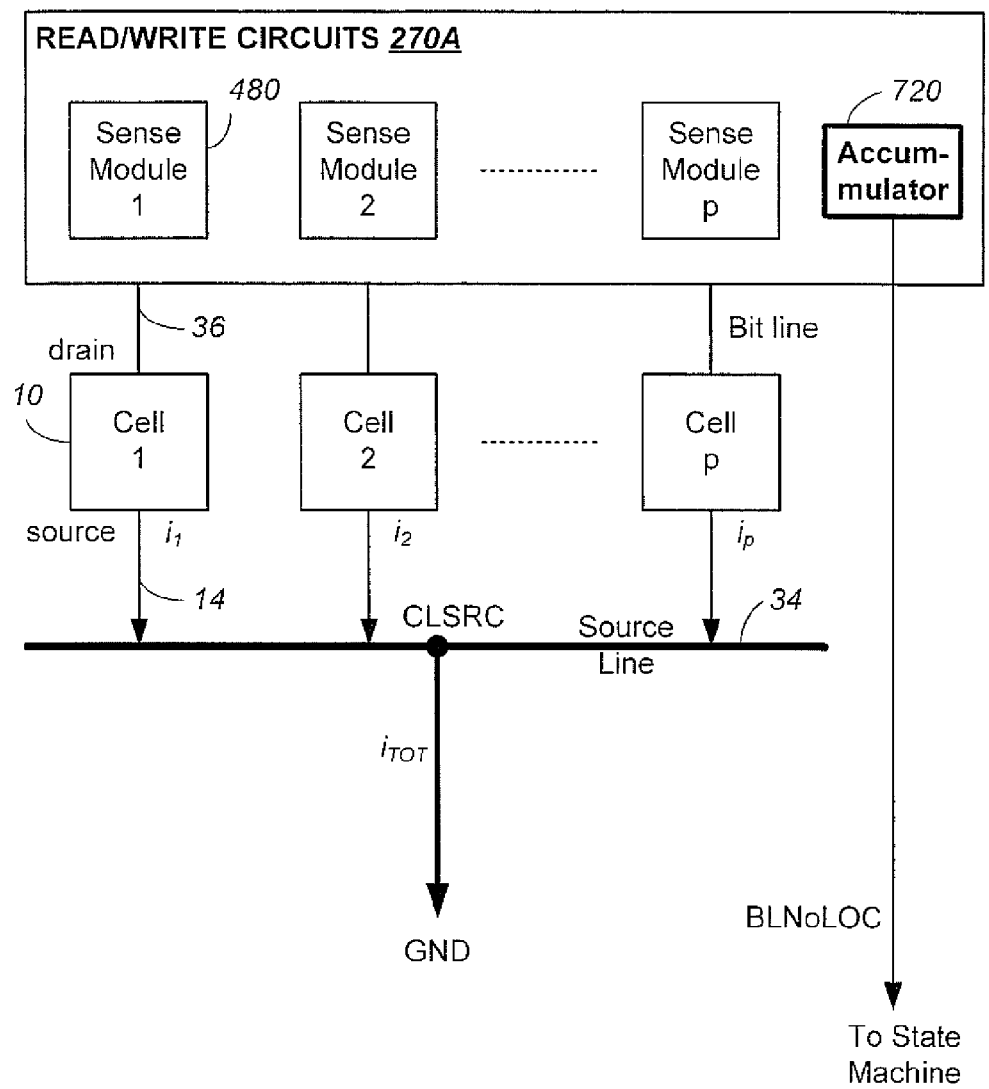
FIG. 19 illustrates another embodiment in which the total current flowing in the page of memory cells is estimated by the number of bit lines that has been locked out.

FIG. 19 illustrates another embodiment in which the total current flowing in the page of memory cells is estimated by the number of bit lines that has been locked out. FIG. 19 illustrates the current flowing in a page of memory cells being sensed by corresponding sense modules in the read/write circuits 270A similar to that shown in FIG. 9. An accumulator counts the number of bit lines that have been latched to ground. The total current $i_{TOT}$ can then be estimated as the average current of each cell times the number of bit lines in the page that are not grounded. The accumulator 720 preferably includes logic to provide a signal BLNoLOC to the state machine 112. Whenever the estimated total current $i_{TOT}$ is below a predefined level $i_{MAX}$, BLNoLOC is output HIGH. In response to BLNoLOC being HIGH, the state machine will cause the sensing to execute with bit-line lockout disabled, with the control signal GRS becoming LOW (see FIG. 10). Otherwise, when $i_{TOT} > i_{MAX}$, BLNoLOC will be output LOW and this signals the state machine to operate the sensing with bit-line lockout enabled in order to shut down the current of some memory cells.

Figure 20:
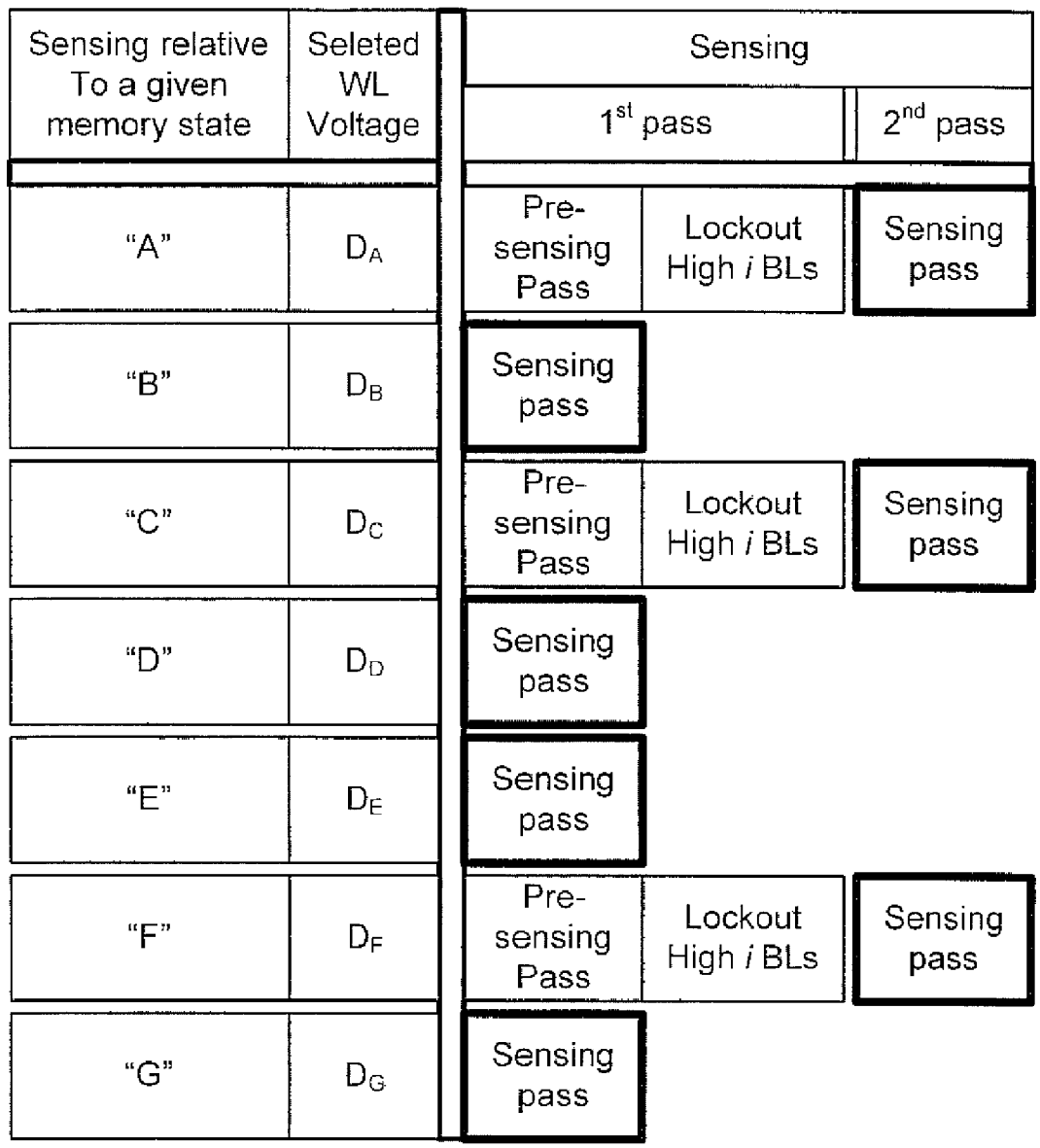
FIG. 20 illustrates one exemplary outcome for selectively enabling bit-line lockout among the multiple passes of a multi-state sensing operation in response to a system current limit being exceeded.

FIG. 20 illustrates one exemplary outcome for selectively enabling bit-line lockout among the multiple passes of a multi-state sensing operation in response to a system current limit being exceeded. In contrast to the examples shown in FIGS. 17A and 17B, the bit-line lockout operation is based on the level of the total current, which is data dependent. Thus, for example, two-pass sensing is invoke when sensing with respect to state "A" to get rid of the highest current states. Then the bit-line lockout is disabled with one-pass sensing for state "B". If thereafter, it is detected that $i_{TOT}$ is about to exceed $i_{MAX}$, the bit-line lockout is enabled again so that two-pass sensing is performed for state "C". Similarly, if the bit-line lockout during state "C" causes a reduction in $i_{TOT}$, it will be enabled again. This remains so while sensing at state "D" and at "E" and allow single-pass sensing until the end of sensing "E". At that point $i_{TOT}$ exceeds or is about to exceed $i_{MAX}$. Thus, the next cycle of sensing state "E" is performed in two passes, etc.

Figure 21:
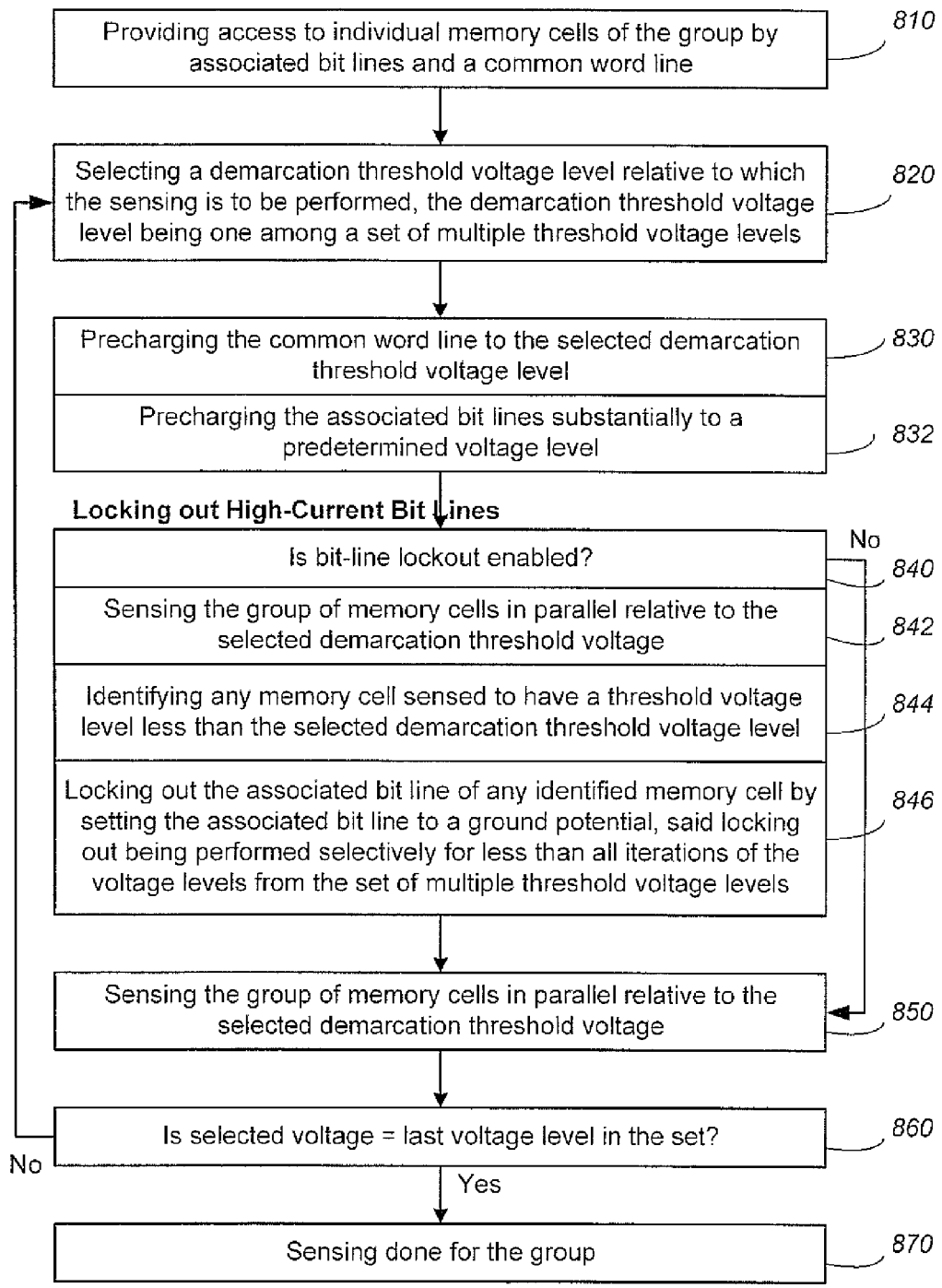
FIG. 21 is a flow diagram illustrating bit-line lockout control during sensing, according to a preferred embodiment of the invention.

FIG. 21 is a flow diagram illustrating bit-line lockout control during sensing, according to a preferred embodiment of the invention.

STEP 810: Providing access to individual memory cells of the group by associated bit lines and a common word line.

STEP 820: Selecting a demarcation threshold voltage level relative to which the sensing is to be performed, the demarcation threshold voltage level being one among a set of multiple threshold voltage levels.

STEP 830: Precharging the common word line to the selected demarcation threshold voltage level.

STEP 832: Precharging the associated bit lines substantially to a predetermined voltage level.

STEP 840: Is bit-line lockout enabled? If enabled, proceeding to STEP 842, otherwise, proceeding to STEP 850.

STEP 842: Sensing the group of memory cells in parallel relative to the selected demarcation threshold voltage.

STEP 844: Identifying any memory cell sensed to have a threshold voltage level less than the selected demarcation threshold voltage level.

STEP 846: Locking out the associated bit line of any identified memory cell by setting the associated bit line to a ground potential, said locking out being performed selectively for less than all iterations of the voltage levels from the set of multiple threshold voltage levels.

STEP 850: Sensing the group of memory cells in parallel relative to the selected demarcation threshold voltage.

STEP 860: Is selected voltage equal to the last voltage level in the set? If equal, proceeding to STEP 870, otherwise, returning to STEP 820.

STEP 870: Sensing done for the group.

Figure 22:
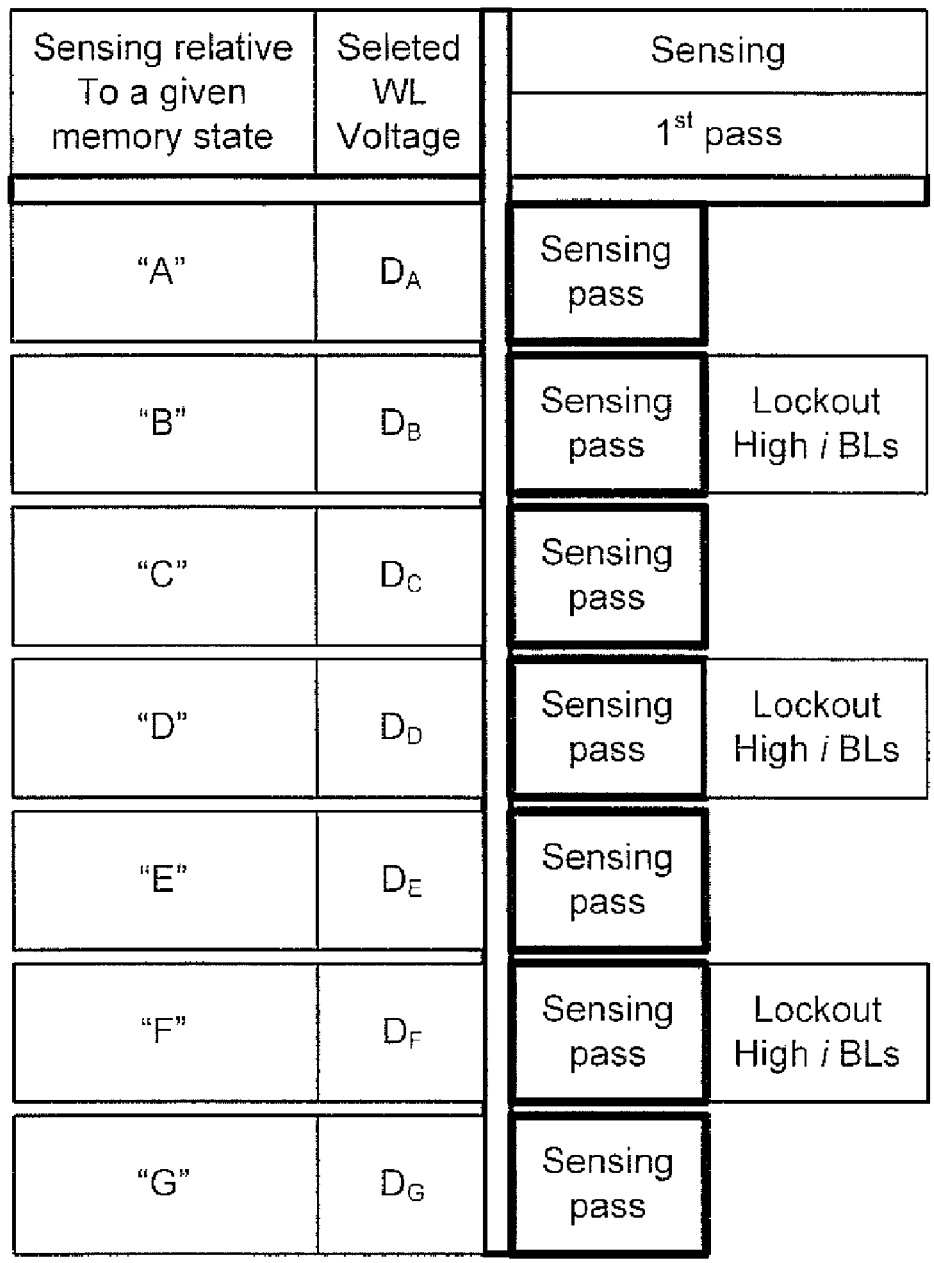
FIG. 22 illustrates an alternative embodiment of a single-pass sensing where the actual sensing is executed without any pre-sensing to lock out high-current cells.

FIG. 22 illustrates an alternative embodiment of a single-pass sensing where the actual sensing is executed without any pre-sensing to lock out high-current cells. Bit-line lockouts are performed responsive to the system's current loading level or to a predetermined schedule. When bit-line lockouts do occur, the bit-line lockouts and the recovery period from them can be concurrent with the word line voltage rising to the next level. In this mode, the increased conduction current can be offset by reduced amount time that the conduction current persists. For this mode to be efficient, it requires that the word line RC time constants be reduced as much as possible so sensing can progress very rapidly from one word line voltage level to the next. For example, this can be accomplished by having shorter word lines or more conductive word lines. The energy per bit read can be minimized by charging all bit lines at once and discharging all of them after the last word line voltage. The conduction energy is minimized by rapidly sensing all states and reducing the times during which current is burned.

Another example is a memory with 16 states. One implementation has the first lockout occurring after the $3^{rd}$ sensed state. All of the first 3 sensing operations will be single strobe with the $3^{rd}$ one finding 4/16=¼ of the cells being ON. Based on the result of this third sensing operation, all cells that have been found to be ON during the third sensing operation will be locked out at once. Moreover, the bit line cross talk recovery time will be simultaneous with the word line rising from the $3^{rd}$ sensing level to the $4^{th}$ sensing level. The next bit lines lockout operation occurs between one strobe sensing at the $7^{th}$ sensing level and the one strobe sensing at the $8^{th}$ sensing level. The next lockout operation occurs between $11^{th}$ and $12^{th}$ sensing levels. There will then be only 3 lockout operations as explained, and every one of the corresponding bit line cross talk recovery times will be concurrent with word lines rising to the next level, while throughout the entire sequence of events cells are allowed to conduct DC current if and when they turn on and before they reach the next lockout operation.

Figure 23:
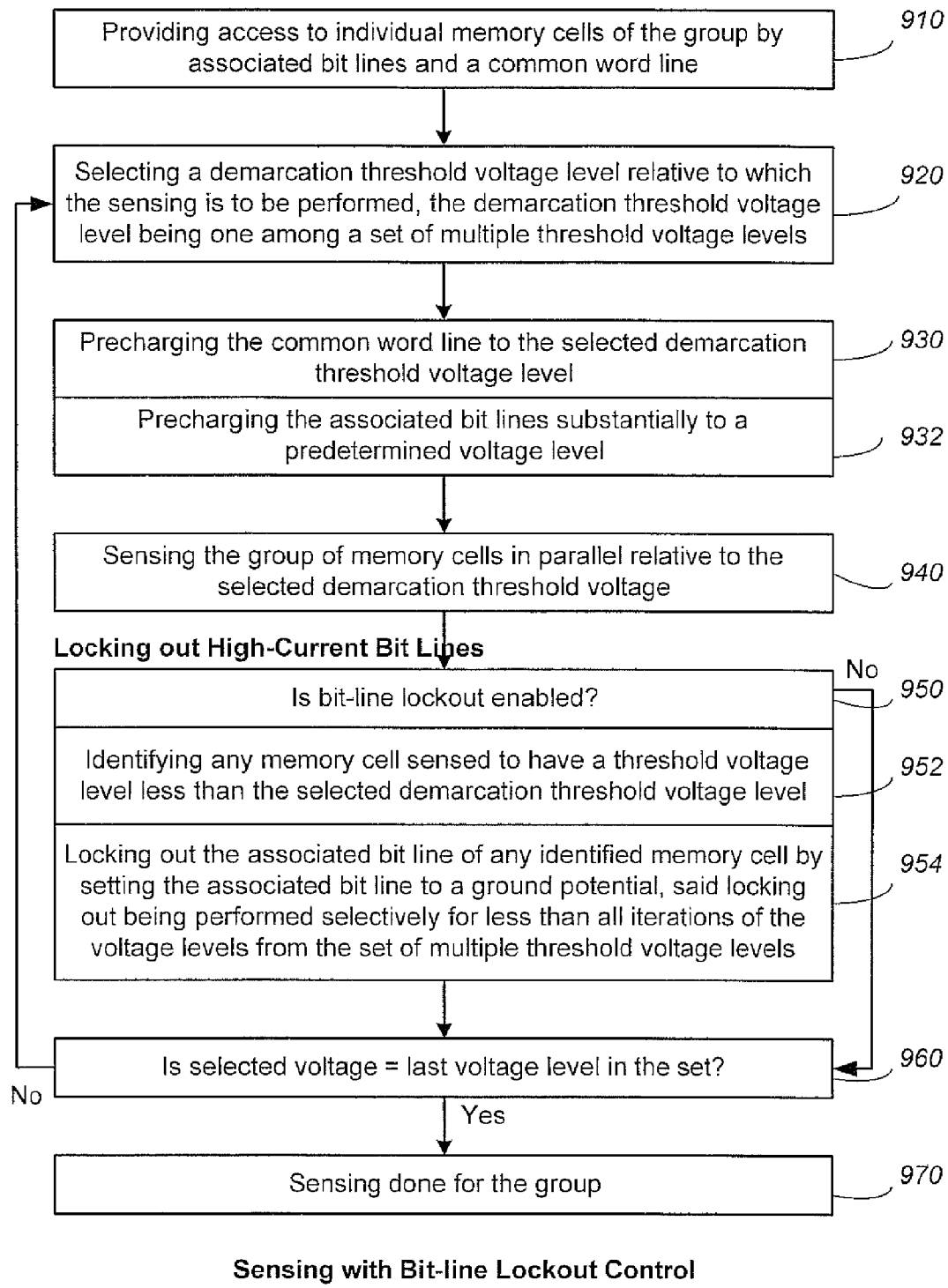
FIG. 23 is a flow diagram illustrating bit-line lockout control during sensing, according to the alternative embodiment shown in FIG. 22.

FIG. 23 is a flow diagram illustrating bit-line lockout control during sensing, according to the alternative embodiment shown in FIG. 22.

STEP 910: Providing access to individual memory cells of the group by associated bit lines and a common word line.

STEP 920: Selecting a demarcation threshold voltage level relative to which the sensing is to be performed, the demarcation threshold voltage level being one among a set of multiple threshold voltage levels.

STEP 930: Precharging the common word line to the selected demarcation threshold voltage level.

STEP 932: Precharging the associated bit lines substantially to a predetermined voltage level.

STEP 940: Sensing the group of memory cells in parallel relative to the selected demarcation threshold voltage.

STEP 950: Is bit-line lockout enabled? If enabled, proceeding to STEP 952, otherwise, proceeding to STEP 960.

STEP 952: Identifying any memory cell sensed to have a threshold voltage level less than the selected demarcation threshold voltage level.

STEP 954: Locking out the associated bit line of any identified memory cell by setting the associated bit line to a ground potential, said locking out being performed selectively for less than all iterations of the voltage levels from the set of multiple threshold voltage levels.

STEP 960: Is selected voltage equal to the last voltage level in the set? If equal, proceeding to STEP 970, otherwise, returning to STEP 920.

STEP 970: Sensing done for the group.

FIG. 24 illustrates yet another embodiment of a single-pass sensing where the actual sensing is executed without any lockout of high-current cells. The avoidance of any lockouts may be the result of a predetermined schedule or may be responsive to the system's current loading level. In this mode, the increased conduction current can be offset by the reduction in the bit line voltage described earlier and also the reduced amount time that the conduction current persists.

As described earlier, two features help towards the implementation of reducing the number of sensing passes, even to the point of requiring no two-pass sensing. One is the reduction of bit line voltage and the other is randomization or scrambling of data.

It is very effective to reduce the bit line voltage during read and verify operations in order to minimize conduction energy, and capacitive charging energy. The reduced cell currents will also alleviate the CLSRC loading and allow fewer lockout operations. The sensing current, Iref, has to be reduced too so that a good trans-conductance value is obtained at (VT, Iref) point despite the reduction in bit line voltage and the resulting reduction in ON current.

However, with the sensing schemes in the conventional memory architecture the reduction of bit line voltage is limited. This is because conventional sensing schemes employ the bit line capacitance to measure the cell's conduction current. The bit line is precharged to some initial voltage and then allowed to be discharged by the cell current. The rate of discharge is a measure of the cell current. The bit line voltage is limited in that the initial voltage can not be so low that it discharges to some undetectable value relative to the RC time constant of the bit line. Additionally, the reference sense current is pegged to the RC constant of the bit line and can not be adjusted easily.

On the other hand, in sensing schemes first introduced in ABL memory architecture, the sensing is independent of the bit line's time constant, as the discharge rate is relative to a dedicated capacitor provided with the sense amplifier. Such sensing schemes have been disclosed in U.S. Pat. No. 7,196,931. The RC constant of the dedicated capacitor can be adjusted for optimum sensing. In this case, the bit line voltage can be lower further. One consequence of this is that the sensing will have to be performed at a lower reference current. This is easily accomplished by a suitable choice of the value of the capacitor.

With data scrambling/randomization there are roughly equal number of cells in each state. This means 1/16 of cells are in each of the states. With data scrambled, it is preferred to use single-pass (one-strobe) sensing as only 1/16 of cells turn on at each higher control gate voltage, and when they first turn on they are not turning on with full conduction if the state to state separation is only 400 mV. Even with the 2-pass scheme described earlier, a significant number of cells that should be locked out after the first strobe escape the lockout because of high cell source loading present during the first strobe. These escapees will then conduct an order of magnitude more current during the bit-line-to-bit-line-cross talk recovery period since the non-escapees have been shut down and the CLSRC loading has been reduced. So an escapee which escaped the first strobe because it had, say 70 nA current will conduct 700 nA as soon as the non-escapees are locked out and the CLSRC voltage is reduced. The first strobe or the second strobe integration times are 0.4 usec. But, the intervening bit line to bit line cross talk recovery time is 4.4 usec. Under these conditions, the 2-pass scheme (i.e., two strobes) is therefore quite counter productive in terms of both performance and energy consumption. It is useful when the data is not randomized, and/or when the bit line voltage can not be kept low, and/or state to state separation is substantial (which is not the case for 8-state or 16-state memory). Even in 4-state memory with larger state to state separation, by just reducing the bit line voltage such that average cell's ON current is ~0.3 uA, it is possible to have more than half the cells on the page to be fully conducting and still use one strobe which is much faster and more energy efficient.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. A method of sensing a group of nonvolatile memory cells in parallel, comprising:
   (a) providing access to individual memory cells of the group by associated bit lines and a common word line;
   (b) selecting a demarcation threshold voltage level relative to which the sensing is to be performed, the demarcation threshold voltage level being one among a set of multiple threshold voltage levels;
   (c) sensing, in a predetermined number of more than one sensing pass, the group of memory cells in parallel relative to the selected demarcation threshold voltage,
   wherein whenever in less than all of said predetermined number of more than one sensing pass, a condition for bit-line lockout by grounding the bit-line is enabled, performing (d1) to (d2) before proceeding to (e), otherwise skipping to (e):
   (d1) identifying any memory cell sensed to have a threshold voltage level less than the selected demarcation threshold voltage level;
   (d2) locking out the associated bit line of any identified memory cell by setting the associated bit line to a ground potential, said locking out being performed selectively for less than all iterations of the voltage levels from the set of multiple threshold voltage levels, whenever an enabling condition for bit-line lockout is satisfied; and
   (e) repeating (b) to (e) for a next voltage level from the set of multiple threshold voltage levels until every voltage level from the set has been iterated.

2. The method as in claim 1, wherein:
said performing (d1) to (d2) further includes:
(d3) sensing the group of memory cells in parallel relative to the selected demarcation threshold voltage.

3. The method as in claim 1, wherein:
the enabling condition for bit-line lockout includes when an aggregated current of the group of memory cells reaches a predetermined current level.

4. The method as in claim 1, wherein:
the enabling condition for bit-line lockout includes when the number of identified memory cells reaches a predetermined number.

5. The method as in claim 1, further including:
operating the bit lines at a predetermined minimum bit line voltage during sensing.

6. The method as in claim 1, wherein:
the enabling condition for bit-line lockout includes when the selected demarcation threshold voltage level coincides with a predetermined level among a subset of the set of multiple threshold voltage levels.

7. The method as in claim 6, wherein:
the subset is formed by selecting substantially equally spaced apart demarcation threshold voltage levels among the set of multiple threshold voltage levels.

8. The method as in claim 7, wherein:
the group of memory cells stores data coded in a pseudo-random pattern.

9. The method as in claim 6, wherein:
the subset is formed by selecting every n demarcation threshold levels among an ordered set of multiple threshold voltage levels, and n is an integer greater than one.

10. The method as in claim 1, wherein:
the set of demarcation threshold voltages contains at least three voltage levels.

11. The method as in claim 1, wherein:
the set of demarcation threshold voltages contains at least seven voltage levels.

12. The method as in claim 1, wherein:
the set of demarcation threshold voltages contains at least fifteen voltage levels.

13. The method as in claim 1, wherein said sensing is a part of a read operation to read the memory states programmed into said group of memory cells.

14. The method as in claim 1, wherein said sensing is a part of a program operation to verify if any of the memory cells has been programmed relative to the selected demarcation threshold voltage.

15. A nonvolatile memory, comprising:
an array of memory cells accessible by bit lines and word lines;
a group of sensing circuits for sensing conduction currents in a corresponding group of memory cells in parallel wherein individual memory cells of the group as accessible by associated bit lines and a common word line;
a word line voltage supply for precharging the common word line to a selected demarcation threshold voltage level relative to which the sensing is to be performed, the demarcation threshold voltage level being one among a set of multiple threshold voltage levels;
a bit line voltage supply for precharging the associated bit line substantially to a predetermined voltage level;
a set of control signals for controlling the group of sensing circuits to sense the group of memory cells in parallel relative to the selected demarcation threshold voltage in a predetermined number of more than one pass; and
a bit-line grounding circuit for each sensing circuit to ground the associated bit line responsive to both a sense result of said each sensing circuit and a control signal which is enabled for bit-line lockout during sensing for less than all of said predetermined number of more than one sensing pass.

16. The nonvolatile memory as in claim 15, wherein:
the sense result is when the memory cell being sensed has a conduction current higher than a reference sense current; and
the control signal is asserted when an enabling condition for bit-line lockout is satisfied.

17. The nonvolatile memory as in claim 16, wherein:
the enabling condition for bit-line lockout includes when an aggregated current of the group of memory cells reaches a predetermined current level.

18. The nonvolatile memory as in claim 16, wherein:
the enabling condition for bit-line lockout includes when the number of identified memory cells reaches a predetermined number.

19. The nonvolatile memory as in claim 16, wherein:
the bit line voltage supply supplies a predetermined minimum bit line voltage during sensing.

20. The nonvolatile memory as in claim 16, wherein:
the enabling condition for bit-line lockout includes when the selected demarcation threshold voltage level coincides with a predetermined level among a subset of the set of multiple threshold voltage levels.

21. The nonvolatile memory as in claim 20, wherein:
the subset is formed by selecting substantially equally spaced apart demarcation threshold voltage levels among the set of multiple threshold voltage levels.

22. The nonvolatile memory as in claim 21, wherein:
the group of memory cells stores data coded in a pseudo-random pattern.

23. The nonvolatile memory as in claim 20, wherein:
the subset is a selection of every n demarcation threshold levels among an ordered set of multiple threshold voltage levels, and n is an integer greater than one.

24. The nonvolatile memory as in claim 15, wherein:
the set of demarcation threshold voltages contains at least three voltage levels.

25. The nonvolatile memory as in claim 15, wherein:
the set of demarcation threshold voltages contains at least seven voltage levels.

26. The nonvolatile memory as in claim 15, wherein:
the set of demarcation threshold voltages contains at least fifteen voltage levels.

27. The nonvolatile memory as in claim 15, wherein said group of sensing circuits is operated in a read operation to read the memory states programmed into said group of memory cells.

28. The nonvolatile memory as in claim 15, wherein said group of sensing circuits is operated in a part of a program operation to verify if any of the memory cells has been programmed relative to the selected demarcation threshold voltage.

* * * * *